United States Patent [19]

Tokisue et al.

[11] Patent Number: 5,258,047
[45] Date of Patent: Nov. 2, 1993

[54] HOLDER DEVICE AND SEMICONDUCTOR PRODUCING APPARATUS HAVING SAME

[75] Inventors: Hiromitsu Tokisue; Hiroyuki Kitsunai, both of Ibaraki; Nobuo Tsumaki, Ushiku; Hiroshi Inouye, Ibaraki, all of Japan

[73] Assignee: Hitachi, Ltd., Tokyo, Japan

[21] Appl. No.: 800,834

[22] Filed: Nov. 29, 1991

[30] Foreign Application Priority Data

Nov. 30, 1990 [JP] Japan ................. 2-329251

[51] Int. Cl.⁵ .................................... B05B 13/00
[52] U.S. Cl. ................... 29/25.01; 29/25.07; 29/25.03; 118/500
[58] Field of Search ............. 29/25.01, 25.02, 25.03; 118/500, 503

[56] References Cited

U.S. PATENT DOCUMENTS 4,817,556 4/1989 Mears et al. ................. 118/503
4,897,171 1/1990 Ohmi ........................... 118/500

FOREIGN PATENT DOCUMENTS 63-95644 4/1988 Japan .

*Primary Examiner*—Brian E. Hearn
*Assistant Examiner*—Kevin M. Picardat
*Attorney, Agent, or Firm*—Antonelli, Terry Stout & Kraus

[57] ABSTRACT

A device for holding an object by electrostatic force includes a body made of a dielectric of a low resistivity, such as SiC, and an electrode provided on that surface of the device body facing away from a holder surface, so that a potential difference is produced between the object and the holder surface. A change-over switch for grounding the device body to an earth potential of an ambient environment is provided, so that the dielectric can be rapidly brought into a potential equal to the earth potential.

23 Claims, 25 Drawing Sheets

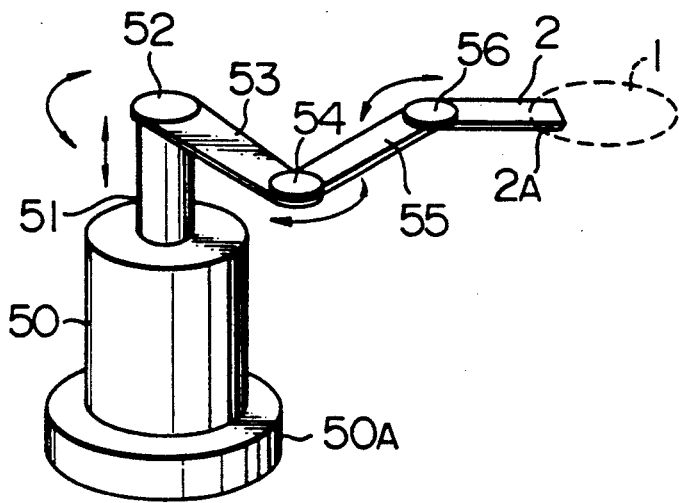
F I G. 1
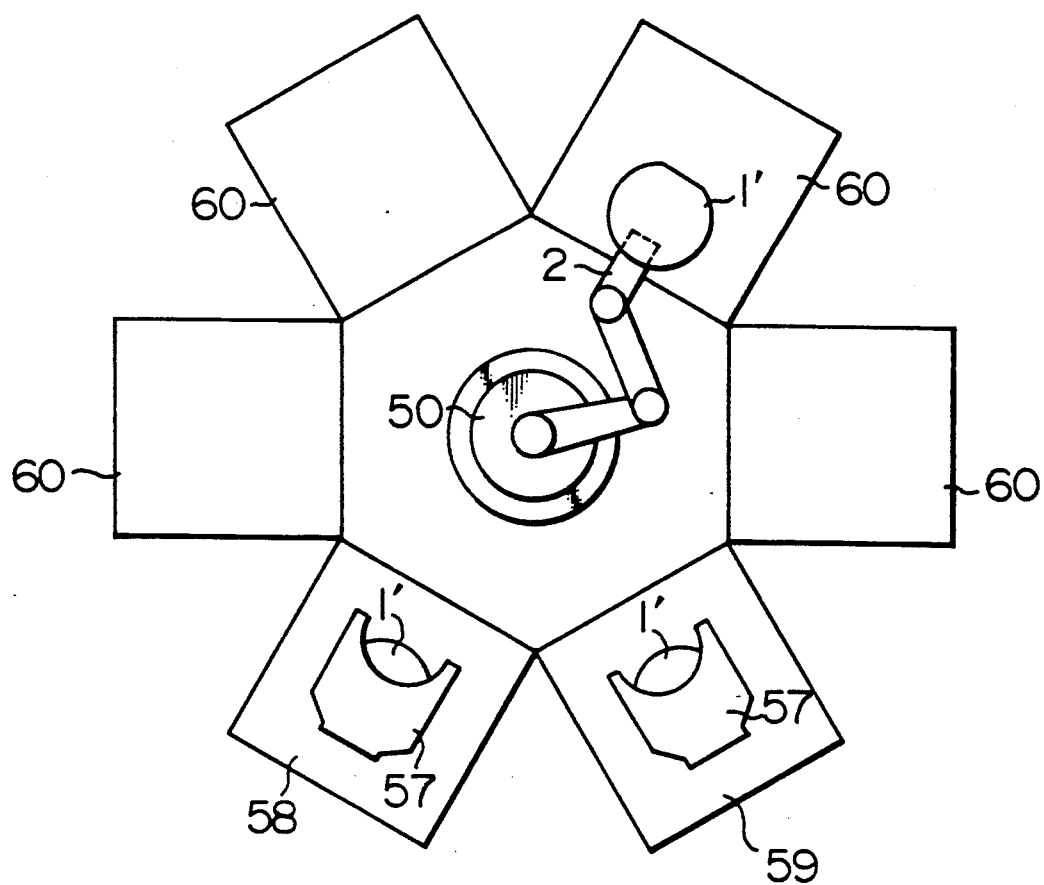
F I G. 2

HOLDER DEVICE AND SEMICONDUCTOR PRODUCING APPARATUS HAVING SAME

BACKGROUND OF THE INVENTION

This invention relates to a holder device for holding a semiconductor, such as a wafer, or a conductor, and more particularly to a holder device for holding a semiconductor wafer or the like by an electrostatic attractive force in vacuum orin a reduced-pressure atmosphere. The invention also relates to a semiconductor producing apparatus having such a holder device.

A device for holding a semiconductor wafer by an electrostatic attractive force is described, for example, in Japanese Patent Unexamined Publication No. 63-95644 and Applied Mechanical Engineering (the May, 1989 issue, pages 129 to 131). In these prior art techniques, an insulating film is formed at least on a surface of an electrode, and this insulating film is formed by mixing a conductor, a semiconductor, or a low-resistivity material with an insulating material of a high volume resistivity.

Recently, with a microscopic design of a circuit pattern of semiconductor chips, there have been a demand for a holder device capable of holding a wafer in a more flat manner for heating and cooling the wafer during a production process in vacuum or a reduced-pressure atmosphere, and also there has been a demand for a handling device which is clean and is capable of holding a reverse surface of the wafer.

The holding force obtainable with the devices of the above prior art techniques is small. Further, even if voltage of opposite sign (polarity) is applied in order to remove residual static charges in the insulating film when releasing the wafer from the holder device, this operation requires 3 to 5 seconds. Further, since the thin insulating film is formed on the electrode, the insulating film is liable to be damaged by a thermal stress due to a change in the ambient temperature, and also the insulating film is liable to be damaged or short-circuited upon contact of other object with the surface of the insulating film.

Further, because of the nature of the structure, the electrode of a high rigidity for supporting the thin insulating film, as well as a device frame for supporting this electrode, has been needed. Therefore, it has been difficult to achieve a compact construction of the device.

Further, because of an electric field generated around the wafer and the holder device subjected to high voltage, dust around them is attracted toward the device, and deposits on the wafer, thereby contaminating the wafer.

SUMMARY OF THE INVENTION

It is an object of this invention to provide a holder device which can provide a large holding force even in vacuum or a reduced-pressure or evacuated atmosphere, and also to provide a semiconductor producing apparatus having such a holder device.

Another object of the invention is to provide a holder device which enables an object, such a wafer, held thereon to be released therefrom in a short time, and also to provide a semiconductor producing apparatus using such a holder device.

A further object of the invention is to provide a holder device for holding a semiconductor wafer which device prevents dust from depositing on the wafer through electrostatic precipitation, and also to provide a semiconductor producing apparatus using such a holder device.

A still further object of the invention is to provide a holder device in which the durability of a hand body is improved.

A further object of the invention is to provide a holder device in which the temperature of a hand body can be controlled.

The above objects of the invention have been achieved by a holder device comprising;

a body having a holder surface for attractively holding an object, the body being composed of a dielectric;

an electrode provided on that surface of the body facing away from the holder surface; and a voltage generating device for producing a potential difference between the electrode and the object.

In one example of the invention, means for grounding a wafer to an earth potential of an ambient environment is provided, and there is provided a change-over switch which stops the supply of the power from the voltage generating device and also grounds the electrode to the earth potential of the ambient environment, when the wafer is to be released from the holder surface.

In another example of the invention, projections or convex portions are provided at the holder surface for holding the wafer.

In a further example of the invention, an electrically-conductive cover of a conductor or a semiconductor is provided at the outer peripheral portion of the wafer holder surface via an insulating member, so as to cover the outer surface of the hand body, and this electrically-conductive cover is grounded to the earth potential.

In a further example of the invention, recesses in the holder surface is filled by forming a film of a material of the same kind as that of the hand body, and this surface is formed into a mirror surface.

In a further example of the invention, a dielectric film is made, for example, of SiC having a resistivity of not more than 1010 cm, and the dielectric film having a thickness of not less than 1 mm.

In a further example of the invention, the dielectric film and the electrode are generally equal in thermal expansion coefficient to each other.

In a further example of the invention, a cooling device is provided in the interior of the holder device, and a groove-like passage for flowing a fluid therethrough is formed in the holder surface, thereby supplying heat transfer fluid from a cooler to the holder surface.

In a further example of the invention, a heating device is provided in the interior of the holder device.

BRIEF DESCRIPTION OF THE DRAWINGS

FIG. 1 is a perspective view of a handling device according to the present invention;

FIG. 2 is a plan view of a semiconductor producing apparatus according to the present invention;

DESCRIPTION OF THE PREFERRED EMBODIMENTS

Figure 3:
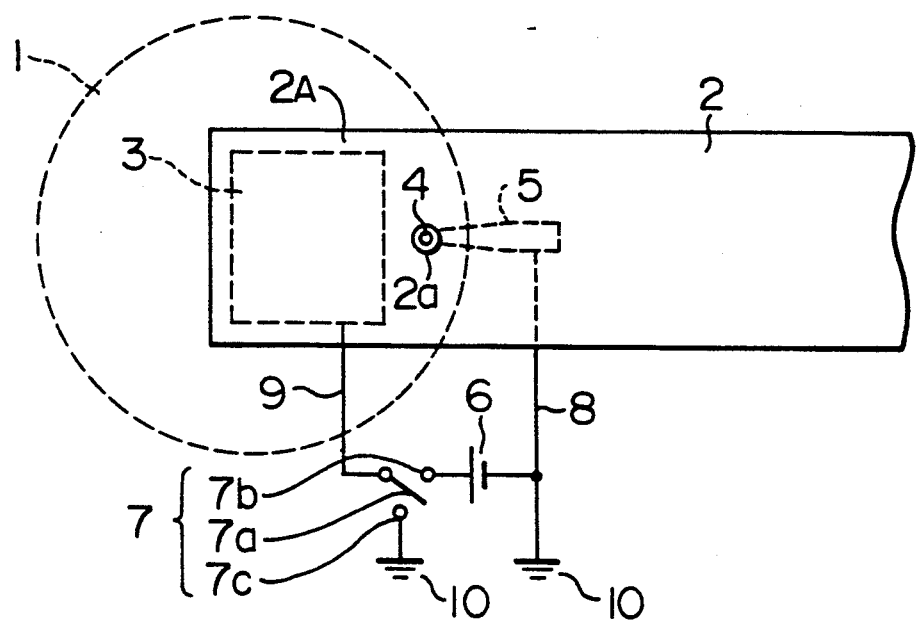
FIG. 3 is a plan view of a hand body shown in FIGS. 1 and 2.

FIGS. 1 to 6 show a first embodiment of the present invention. In these Figures, an object 1 to be attractively held, such as a conductor and a semiconductor (e.g. semiconductor wafer), is attracted and held by a hand body 2 of a handling device. For this purpose, the hand body 2 has a holder surface 2A for attractively holding the object 1.

As shown in FIG. 1, the handling device comprises a base portion 50 mounted on a fixed bed 50a, a vertically-movable shaft 51 moved upward and downward by a drive device (not shown) mounted within the base portion 50, first, second and third rotatable shafts 52, 54 and 56, a first arm 53 provided between the first and second rotatable shafts 52 and 54, a second arm 55 provided between the second and third rotatable shafts 54 and 56, and the hand body 2 mounted on the third rotatable shaft 56.

In a semiconductor producing apparatus of a multi-chamber type (whose chambers are kept to vacuum) shown in FIG. 2, a wafer 1', received in a cassette case in a loader chamber 58, is held by the hand body 2 of the handling device, and then is transferred sequentially into processing chambers 60 through movements of the vertically-movable shaft 51 and the rotatable shafts 52, 54 and 56. After the wafer 1' is subjected to processings or treatments in all the processing chambers 60, the wafer 1' is moved into a cassette case 57 in an unloader chamber 59.

Figure 4:
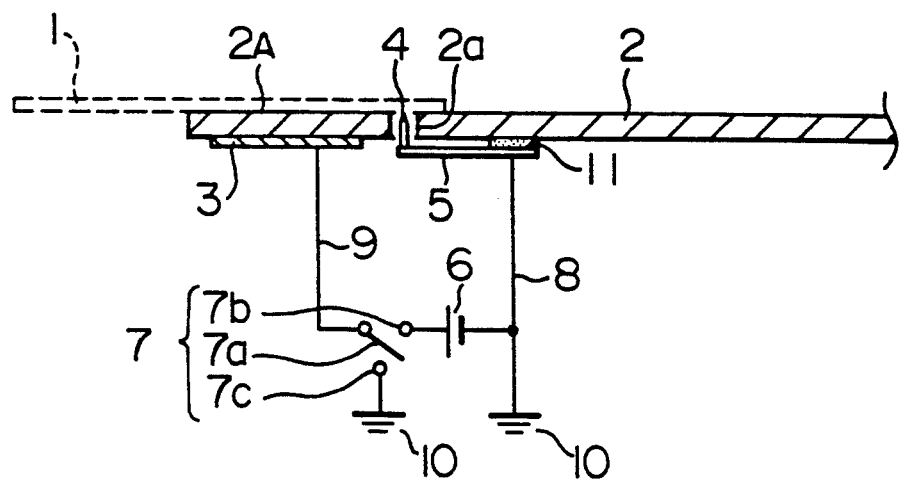
FIG. 4 is a vertical cross-sectional view of the hand body of FIG. 3.

The hand body 2 is shown on an enlarged scale in FIGS. 3 and 4. The hand body 2 is made of a dielectric (e.g. SiC) having a resistivity of not more than $10^{10}$ Ωcm. An electrode 3 is provided on that surface of the hand body 2 (which is made of the dielectric) facing away from the holder surface 2A The electrode 3 is formed by vapor-depositing a thin film of conductive material such as chromium (Cr). A hole 2a is formed through the hand body 2, and an electrically-conductive portion 4, mounted on the hand body 2 through a spring member 5, is inserted in the hole 2a. The conductive portion 4 is grounded via a lead wire 8 to an earth potential of the ambient environment. The electrode 3 is connected to the conductive portion 4 via lead wires 8 and 9, a change-over switch 7 and a voltage generating device 6. When the object 1 is to be held by the hand body 2, a switching element 7a of the change-over switch 7 is connected to a contact 7b, connected to the voltage generating device 6, so as to apply voltage between the electrode 3 and the conductive portion 4. When the object 1 is to be released from the hand body 2, the switching element 7a is connected to a contact 7c, connected to the earth 10, so that the potential of the electrode 3 becomes equal to the earth potential of the ambient environment.

In the holder device of the above construction according to the present invention, when the object 1 is to be attractively held by the hand body 2, the switching element 7a of the change-over switch 7 is connected to the contact 7b. As time, the voltage is applied between the electrode 3 and the conductive portion 4. Since the object 1 is made of an electrically-conductive or a semiconductive material, the potential of the object 1 becomes equal to the potential of the conductive portion 4, that is, equal to the ground potential. Therefore, a potential difference develops between the object 1 and the electrode 3, so that an attractive force F, equal to an attractive force between plate electrodes of a planes parallel plates capacitor, is exerted between the object 1 and the electrode 3. This attractive force F is expressed by the following formula (1):

$$F = -\frac{1}{2\epsilon_0} \epsilon_1^2 \left(\frac{V}{d}\right)^2 S \qquad (1)$$

where $\epsilon_0$ represents the dielectric constant of vacuum, $\epsilon_1$ represents the dielectric constant of the dielectric constituting the hand body 2, V represents the potential difference between the object 1 and the electrode 3, d represents the thickness of the dielectric constituting the hand body 2, and S represents the area of the holding surface corresponding to the area of the electrode 3.

The object 1 is attractively held by the hand body 2 with this attractive force F.

In this first embodiment, since the hand body 2 is made of the dielectric, an electrode of a high rigidity and a device frame for supporting this electrode which have been required for the prior art are not needed, and therefore the holder device can be of a compact size. Further, when the dielectric constituting the hand body 2 is made, for example, of $\alpha$-type SiC having a resistivity of not more than $10^{10}$ $\Omega$cm, its relative or specific dielectric constant ($=\epsilon_1\epsilon_0$) becomes several hundreds to several thousands, and this dielectric constant is more than 10-100 times larger than the relative dielectric constant (about several tens) of the insulating film used in the conventional device. Therefore, even if the thickness d of the dielectric is increased, for example, 10 times larger, the attractive force more than 10 times larger than that obtained with the conventional device can still be obtained.

Figure 5:
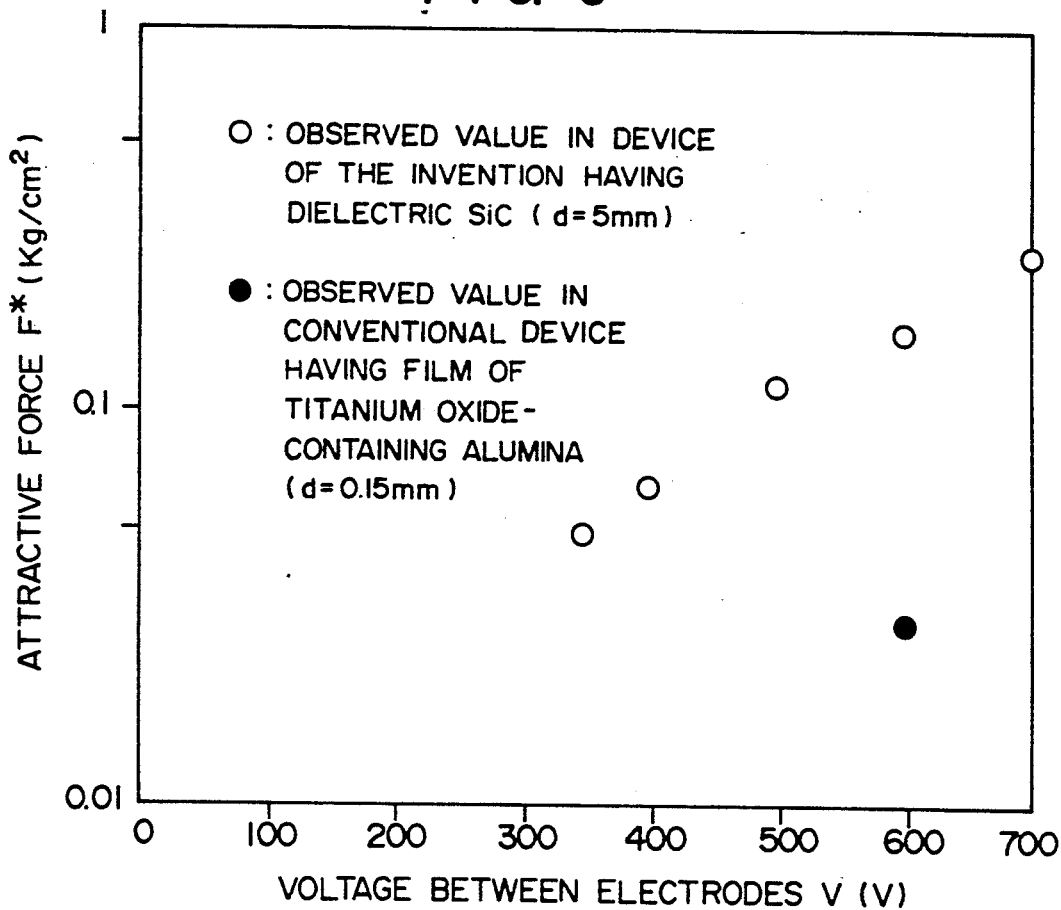
FIG. 5 is a graph showing effects of the present invention.

The attractive forces produced by the device of the present invention and the conventional device were tested through experiments, and results thereof are shown in FIG. 5. As compared with the conventional device using a film of titanium oxide-containing alumina (dielectric) having a thickness d of 0.15 mm, the device of the present invention using a SiC film (dielectric) having a thickness d of 5 mm could produce 5.2 times larger attractive force.

As described above, the thickness of the dielectric can be as large as 5 mm, and therefore there can be provided a hand body in which the dielectric itself serves as a high-strength member. And besides, since the dielectric is thick, the dielectric will not be damaged by a thermal stress due to a change in ambient temperature or by contact with other object, and also an electrical short-circuiting will not develop between the object 1 and the electrode 3.

Further, since the conductive portion 4, grounded to the earth potential of the ambient environment, is contacted directly with the object 1, the potential of the object 1 becomes equal to the earth potential. Therefore, even when the semiconductor wafer or the like is to be held by the holder device, circuit elements formed on the wafer will not be subjected to dielectric breakdown by discharge of static electricity.

When the object is to be released or removed from the attraction device (holder device), the switching element 7a of the change-over switch 7 is connected to the contact 7c (see FIGS. 3 and 4). At time, the voltage applied between the conductive portion 4 and the electrode 3 is interrupted the potential of the electrode 3 becomes equal to the earth potential of the ambient environment. Since the resistivity of the dielectric constituting the hand body 2 is as low as not more than $10^{10}$ $\Omega$cm, the static charge, remaining in the hand body 2, is rapidly dissipated to the earth through the electrode 3. As a result, the potential of the hand body 2 becomes equal to the earth potential, so that the attractive force F is extinguished, and the object 1 is rapidly released or removed from the holder surface 2A of the hand body 2.

For releasing the wafer held by the holder device, in the case of the conventional device using a film of titanium oxide-containing alumina, even if voltage of opposite polarity is applied between the electrode 3 and the conductive portion 4, 3 to 5 seconds are required for achieving this release. On the other hand, in the device of the present invention, the wafer can be released by its own weight in a very short time.

As described above, in this first embodiment, since the hand body of the holder device is made, for example, of SiC having a resistivity of not more than $10^{10}$ $\Omega$cm, the Object such as a wafer can be held in vacuum or a reduced-pressure atmosphere with a large holding force. Further, the object held by the holder device can be released therefrom in a very short time. Further, the construction can be compact, and the surface of the dielectric constituting the holder surface can be improved in durability.

Figure 6:
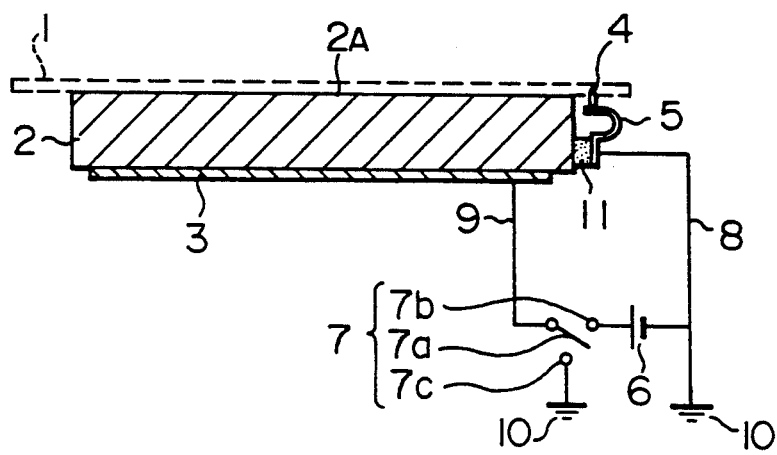
FIG. 6 is a vertical cross-sectional view of a main portion of the hand body.

According to a modified form of the invention shown in FIG. 6, a conductive portion 4 is mounted on an outer periphery of a hand body 2 through an insulating member 11, and an electrode 3 is formed, for example, by vapor-depositing an electrically-conductive thin film.

A second embodiment of the present invention will now be described with reference to FIGS. 7 to 10.

Figure 7:
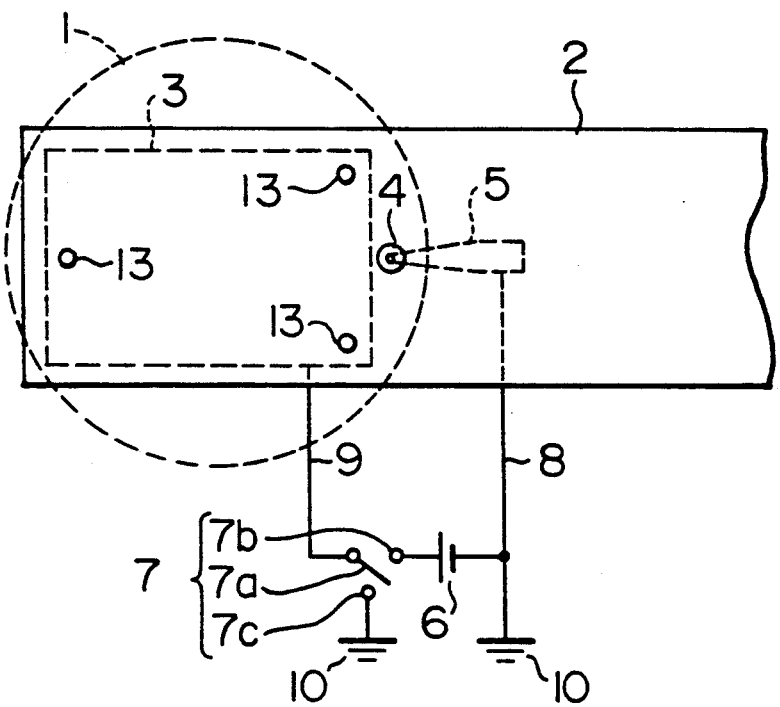
FIG. 7 is a plan view of a modified hand body of the invention.
Figure 8:
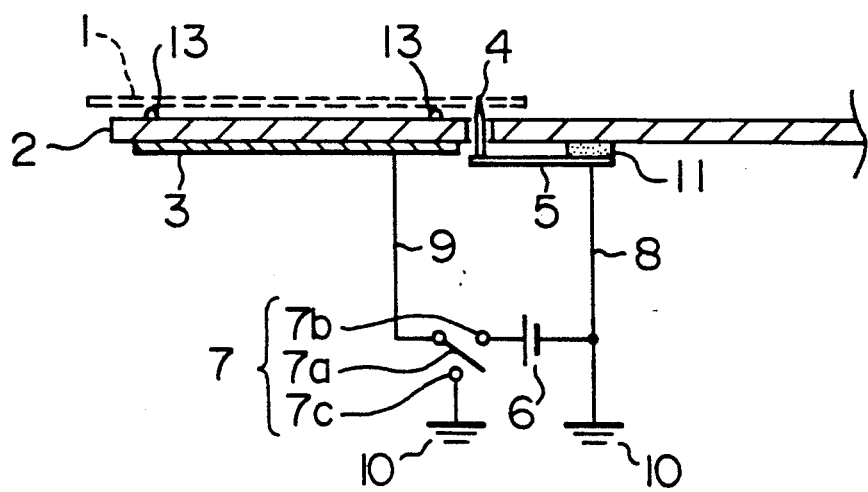
FIG. 8 is a vertical cross-sectional view of the hand body of FIG. 7.

A hand body 2 shown in FIGS. 7 and 8 differs from the hand body 2 shown in FIGS. 3 and 4 in that at least three projections 13 are formed on a holder surface 2A so as to support an object 1 in a three-point supporting manner. The height of each projection 13 is so determined that a sufficient attractive force can be exerted on the object 1, and in this embodiment the projection 13 is formed into a semi-spherical shape. With this construction, the area of contact between the object 1 and the hand body 2 is reduced, and foreign matters are less liable to adhere to the object 1 upon contact of the object 1 with the hand body 2, as compared with the case where the object 1 is substantially fully contacted with the hand body.

Figure 9:
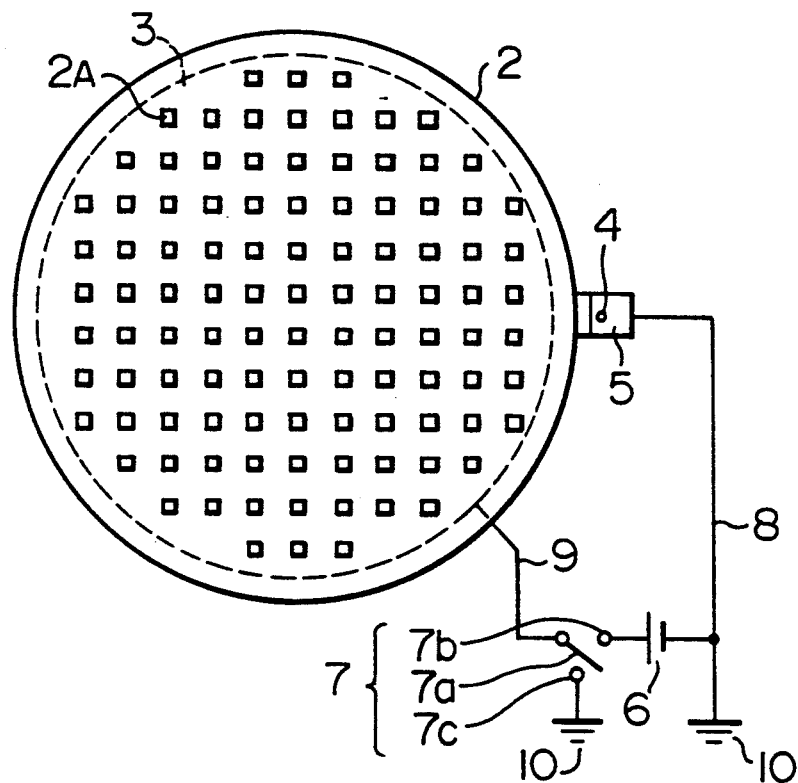
FIG. 9 is a plan view of another modified hand body of the invention.
Figure 10:
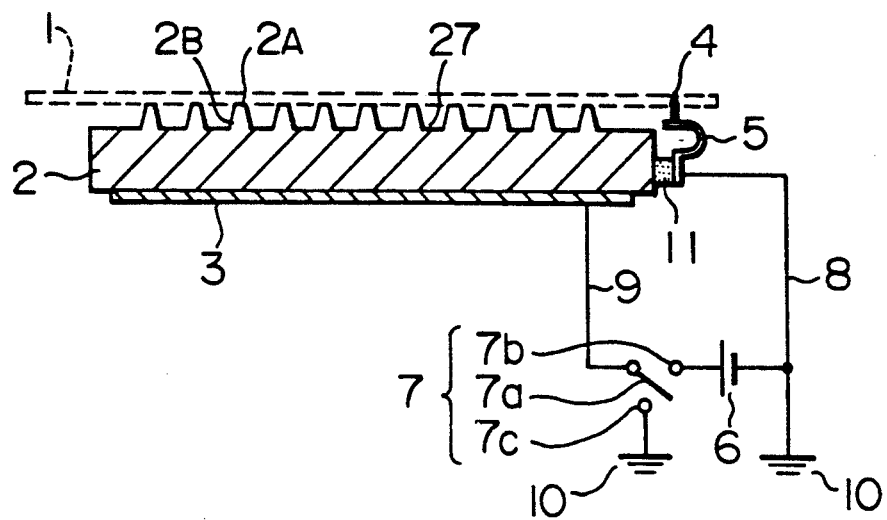
FIG. 10 is a vertical cross-sectional view of the hand body of FIG. 9.

In a hand body 2 shown in FIGS. 9 and 10, steps formed by a plurality of recesses 27 and a plurality of projections 2B are provided at a holder surface 2A of the hand body 2. An object 1 to be held is contacted with the projections 2B slightly higher than the bottoms of the recesses 27. In this second embodiment, the hand body 2 has a circular shape, and an conductive portion 4 is mounted on the outer periphery of the hand body 2 through an insulating member 11. With this construction, the area of contact between a wafer 1' and the hand body 2 is reduced, and foreign matters are less liable to adhere to the reverse surface of the wafer 1'.

Figure 11:
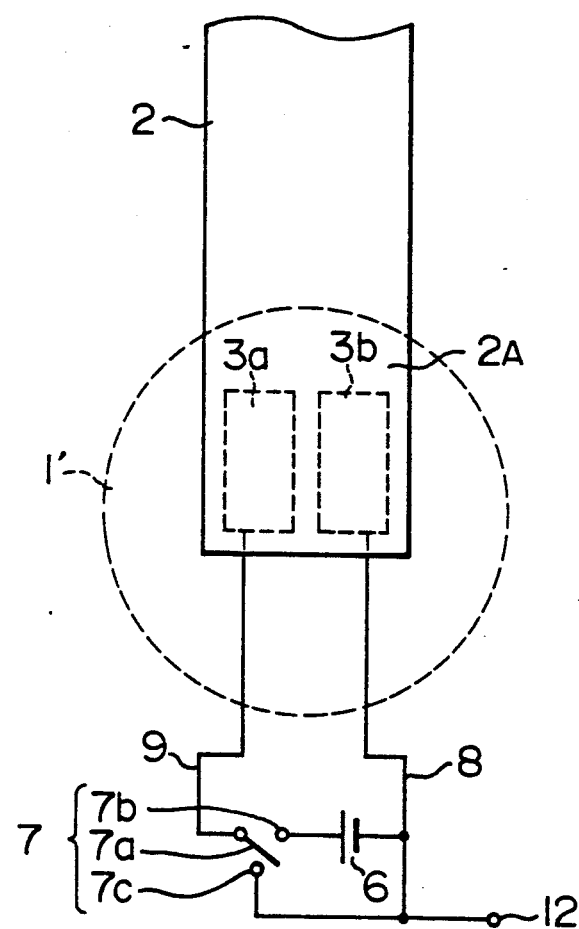
FIG. 11 is a plan view of a further modified hand body of the invention.
Figure 12:
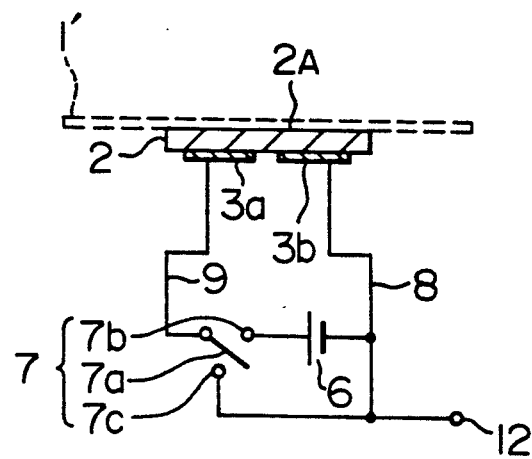
FIG. 12 is a vertical cross-sectional view of the hand body of FIG. 11.

A third embodiment of the present invention is shown in FIGS. 11 and 12. This embodiment is similar in construction to the first embodiment of FIGS. 3 and 4, but differs therefrom in that instead of inserting the conductive portion in the hole 2a, two electrodes 3a and 3b are provided on that surface of a hand body 2 facing away from a holder surface 2A, and that voltage is applied between the two electrodes 3a and 3b. More specifically, a switching element 7a of a change-over switch 7 is connected to one electrode 3a via a lead wire 9, and a contact 7c is connected to the other electrode 3b via a lead wire 8. A voltage generating device 6 is connected between a contact 7b of the change-over switch 7 and the lead wire 8.

When the electrostatic attraction is to be effected by the use of the device of the third embodiment, the switching element 7a of the change-over switch 7 is connected to the contact or terminal 7b to apply voltage to the one electrode 3a. At this time, assuming that the voltage of the electrode 3b is A(V) whereas the voltage produced by the voltage generating device 6 is B(V), the voltage of a wafer 1' is represented by (A+B/2) (V), and due to the potential difference between each of the electrodes 3a and 3b and the wafer 1', the wafer is attracted by the hand body 2. When the wafer is to be released, the switching element 7a of the change-over switch 7 is connected to the contact or terminal 7c. At this time, the electrodes 3a and 3b are equal in potential to each other, and there exists no potential difference between the wafer 1' and these electrodes. Therefore, the wafer 1' is rapidly released from the hand body 2. The reason why the potential of the wafer is adjusted to become 0 volt is to prevent dirt from being attracted to the wafer. With this construction, the need for the conductive portion is obviated, and also it is not required to be electrically connected to the Si wafer covered with $SiO_2$ (insulating film) formed by natural oxidation. This eliminates the possibility of damage to the wafer by a conductive needle used for electrical connection to the wafer.

Figure 13:
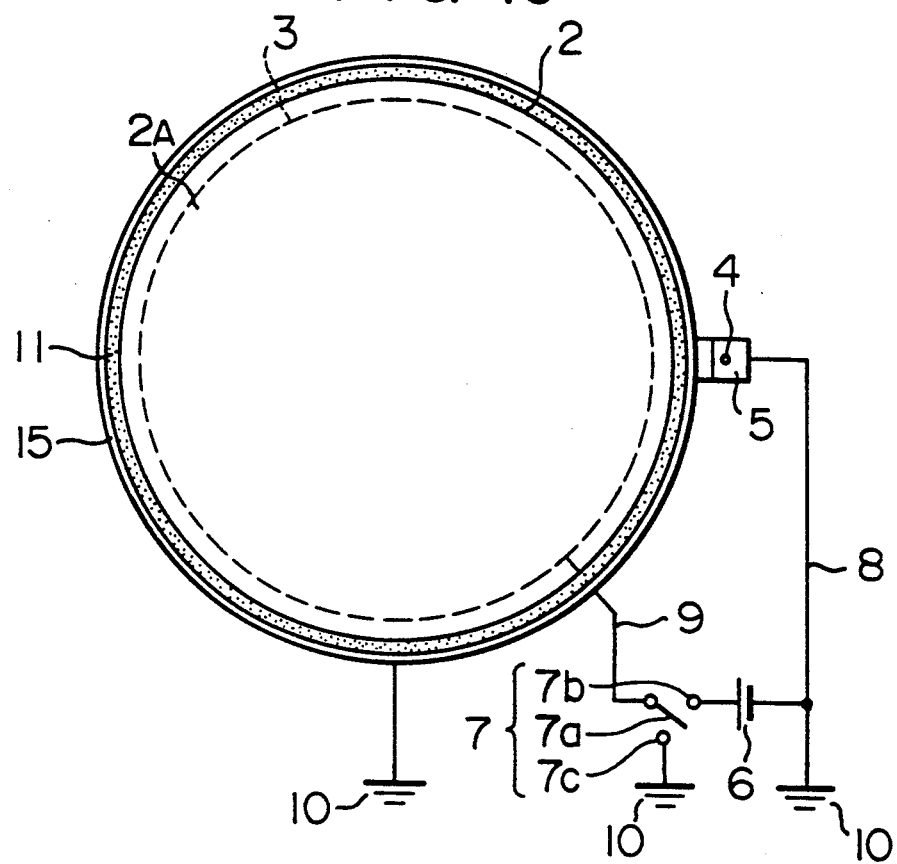
FIG. 13 is a plan view of a further modified hand body of the invention.
Figure 14:
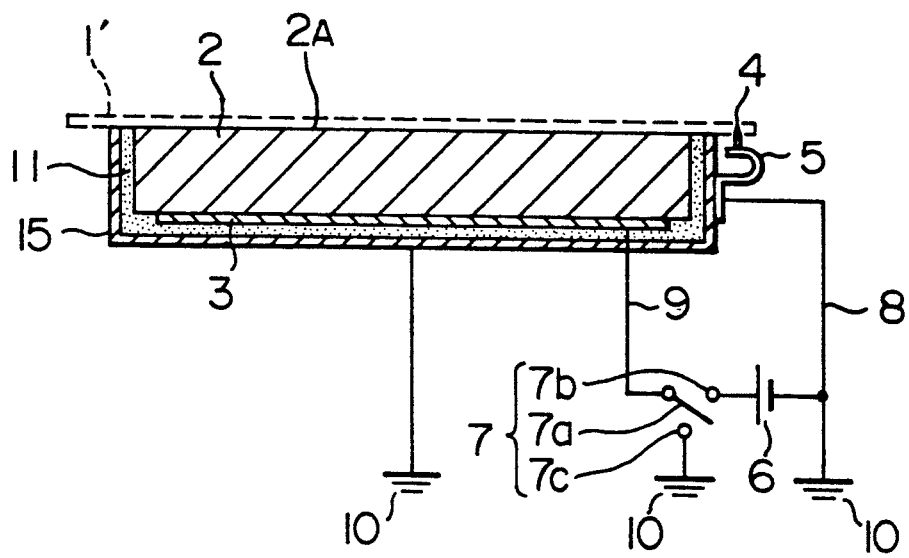
FIG. 14 is a vertical cross-sectional view of the hand body of FIG. 13.

A fourth embodiment of the present invention is shown in FIGS. 13 to 18. A holder device shown in FIGS. 13 and 14 is similar in construction to the first embodiment, but differs therefrom in that an entire outer surface of a hand body 2 except for a holder surface 2A is covered with an electrically-conductive cover 15 made of an electrically-conductive or a semi-conductive material, the conductive cover 15 being grounded to an earth potential of an ambient environment. With this arrangement, the conductive cover 15 and a wafer 1', which are maintained at the earth potential of the ambient environment, enclose an electrode 3 (to which voltage higher or lower than the earth potential is to be applied) in a manner to substantially completely seal this electrode. Therefore, the entire outer surface of the attraction device including the wafer 1' is maintained at the potential equal to the earth potential. This achieves the advantage that the ambient dust attracted toward the device by the electric field is less liable to deposit on the wafer 1'.

Figure 15:
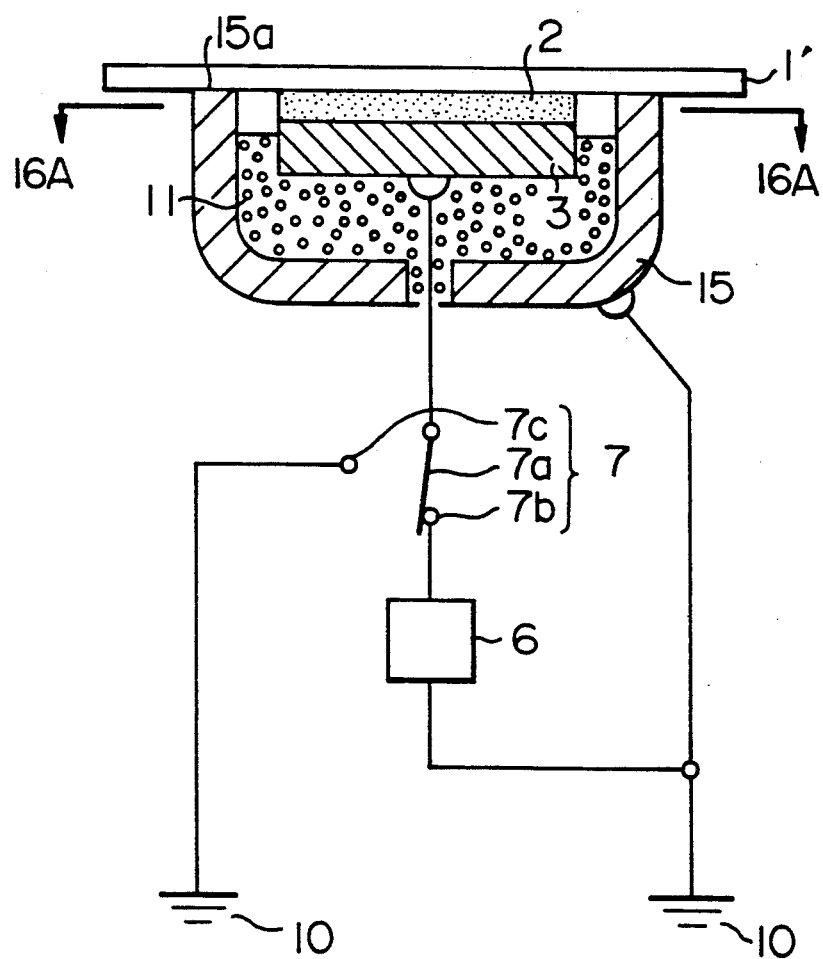
FIG. 15 is a vertical cross-sectional view of a further modified hand body of the invention.
Figure 16:
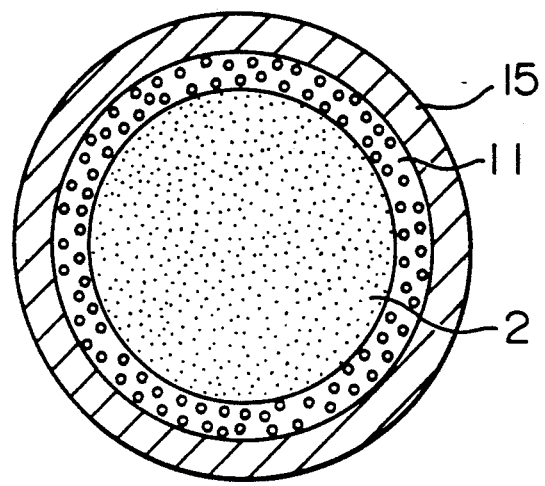
FIG. 16 is a cross-sectional view taken along the line 16A—16A of FIG. 15.

A modified holder device is shown in FIGS. 15 and 16. In this example, a conductive cover 15 is contacted at its mirror surface portion 15a with a wafer 1', and the conductive cover 15 is grounded to an earth potential 10 of an ambient environment. With this arrangement, the conductive cover 15 also performs the function of the conductive portion 4 for electrical connection to the wafer. In this case, the construction is simplified, and the deposition of dust on the wafer can be prevented.

Figure 17:
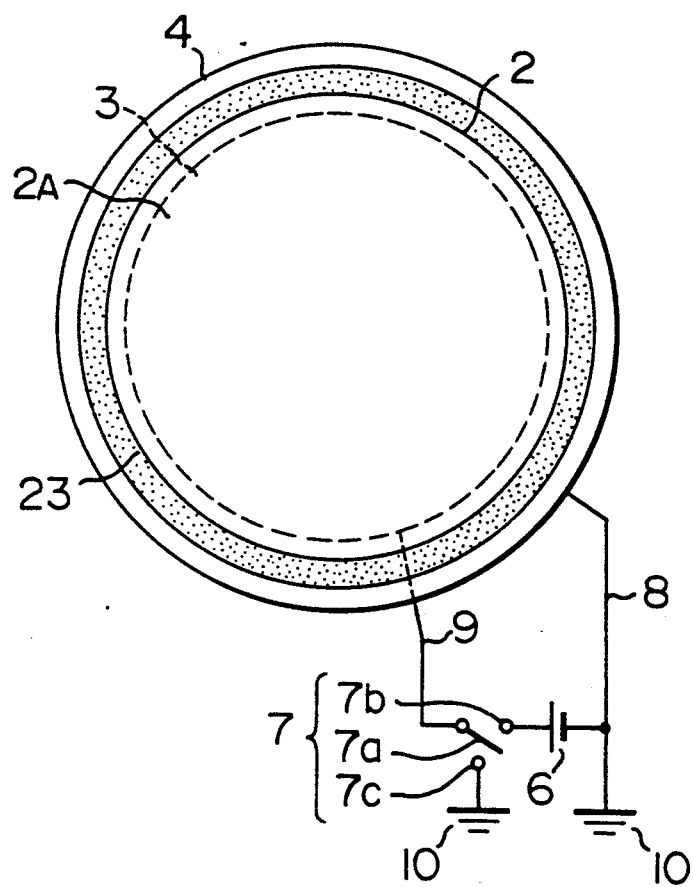
FIG. 17 is a plan view of a further modified hand body of the invention.
Figure 18:
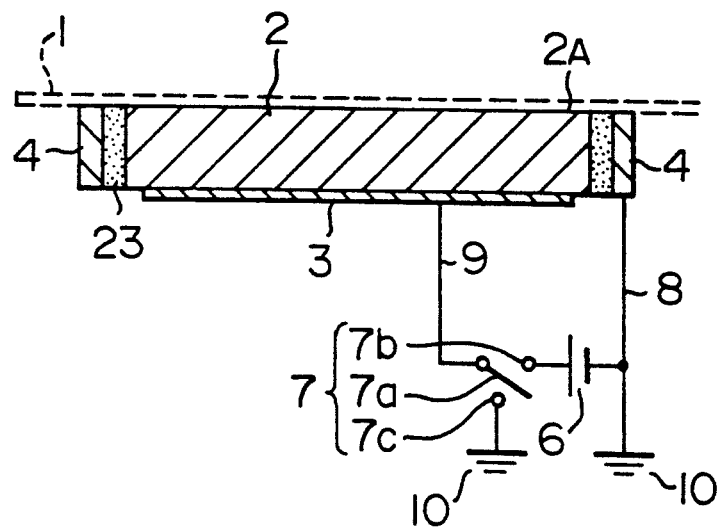
FIG. 18 is a vertical cross-sectional view of the hand body of FIG. 17.

FIGS. 17 and 18 show another modified holder device. In this example, a conductive portion 4 is mounted on an outer periphery of a hand body 2 through an insulating layer 23, and that surface of the conductive portion 4 facing a wafer 1' is formed into a mirror surface, and is contacted with the wafer 1' to provide an electrical connection therebetween. Thus, by forming that surface, adapted to be contacted with the wafer 1', into the mirror surface, damage to the wafer 1' as well as the deposition of dust on the wafer can be prevented.

A fifth embodiment of the present invention is shown in FIGS. 19 to 24. In a holder device shown in FIG. 19, an electrode is made of electrically-conductive ceramics 20. Dielectric ceramic film 2' is formed integrally with the electrically-conductive ceramics 20 serving as the electrode. Referring to a method of producing this holder device, the dielectric ceramic film 2' and the electrically-conductive ceramics 20 (electrode) in their molded condition before sintering are integrally joined together, and then are sintered. In the holder device of this construction, even when the dielectric ceramic film 2' is thin, the dielectric film ceramic 2' will not be damaged by a thermal stress or the like because the dielectric ceramic film 2' and the electrode 20 are generally equal in thermal expansion coefficient to each other.

Figure 19:
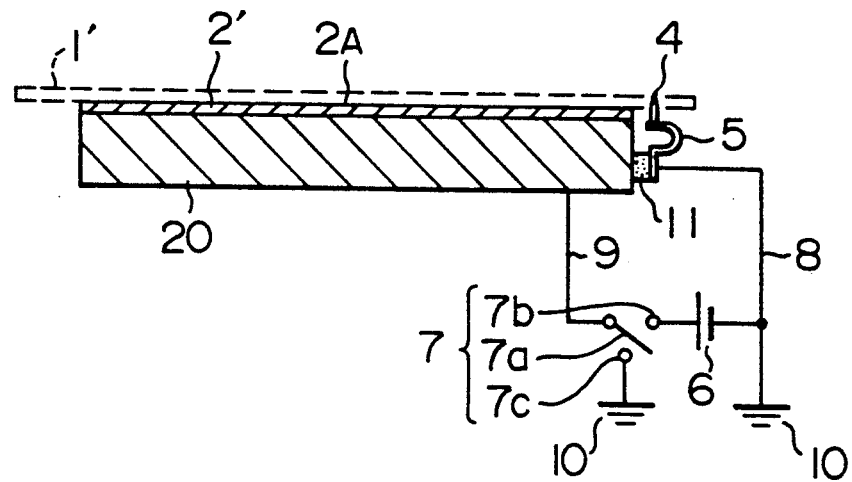
FIGS. 19 and 20 are vertical cross-sectional views of further modified hand bodies of the invention, respectively.
Figure 20:
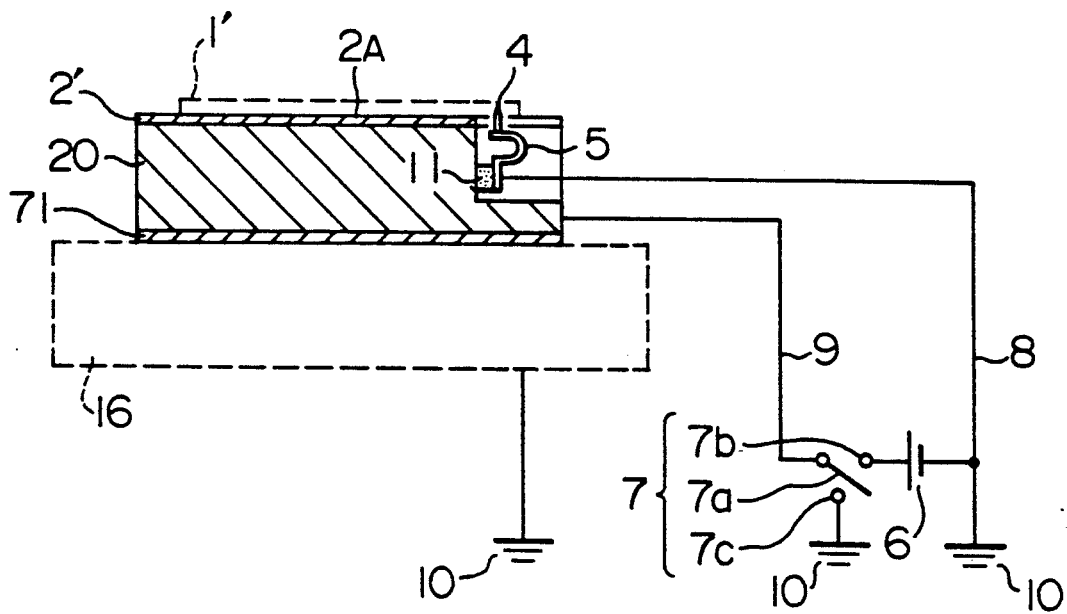
Figure 21:
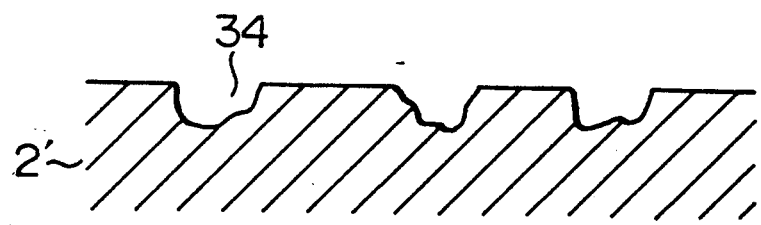
FIGS. 21 to 24 are vertical cross-sectional views showing the condition of formation of a film on a surface of sintered ceramics.
Figure 22:
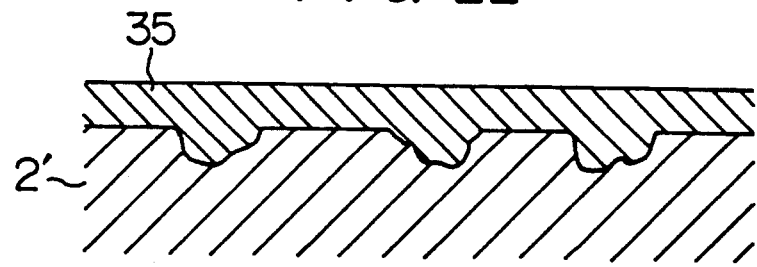
Figure 23:
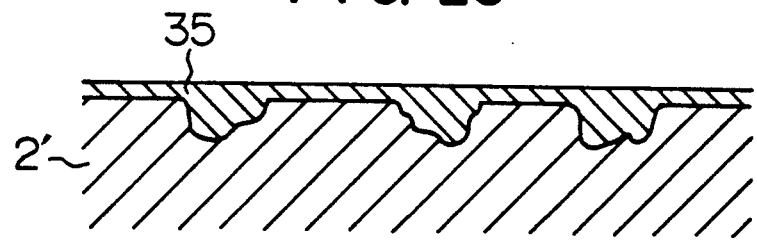
Figure 24:
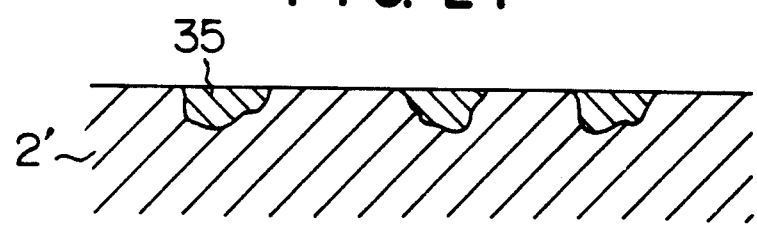

In a modified holder device shown in FIG. 20, electrically-conductive ceramics 20 is sandwiched between dielectric ceramic film 2' for fixing a wafer 1' and a dielectric film 71 for fixing a pallet. These are mounted on a bed 16 which is grounded. In this case, since the dielectric film and the electrode are generally equal in thermal expansion coefficient to each other, the dielectric ceramic film 2' will not be damaged by a thermal stress or the like even if the dielectric ceramic film 2' is thin. In the case where the holder device is formed by the ceramics as shown in FIGS. 19 and 20, the sintered ceramics includes voids (the void percentage: several %), and the voids appear as recesses 34 in the polished surface of the ceramics, as shown in FIG. 21. In the case of SiC, the diameter and depth of the recess 34 are several micrometers, and a foreign matter several micrometers in size i inevitably present in the recess 34. At present, the deposition of dust having a size of not more than 0.1 m has been a problem with the process of producing a semiconductor, and the recessed SiC surface can not be used as a wafer-contacting member. Therefore, preferably, a film 35 of a material of the same kind as that of the dielectric ceramic film 2' is formed on the holder surface by a CVD method to fill up the recesses, as shown in FIG. 22. FIG. 23 shows the case where the thus formed film 35 is polished into a mirror surface. FIG. 24 shows the case where the film 35 is polished to such an extent that the surface of the dielectric ceramic film 2' generally appears, and this procedure is used when the film 35 is different in resistivity or dielectric constant from the dielectric ceramic films 2'. By thus exposing the dielectric ceramic film 2' to the film formation surface, the deposition of foreign matter on the held object can be reduced.

Figure 25:
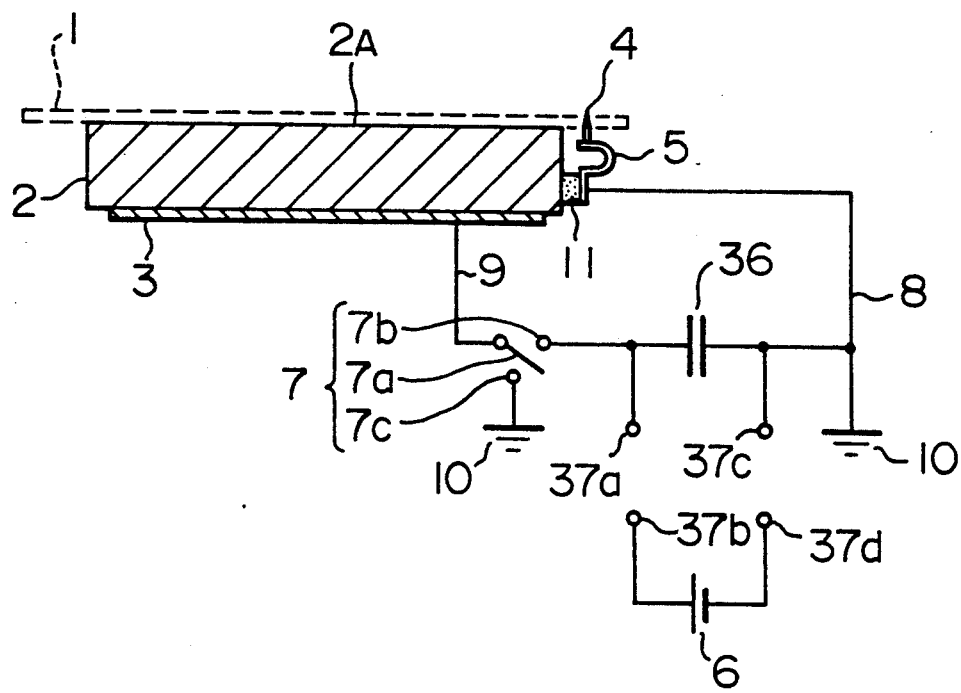
FIGS. 25 and 26 are vertical cross-sectional views of further modified hand bodies of the invention, respectively.

FIGS. 25 to 28 show a sixth embodiment of the present invention. FIG. 25 shows the case where a capacitor 36 is connected in parallel with a voltage generating device 6. By thus providing the capacitor 36 in parallel with the voltage generating device 6, the capacitor 36 feeds the power even if the voltage generating device 6 is disconnected at terminals 37a to 37d, so that an object 1 can be attractively held. Therefore, by the use of a pallet movable in the device, the power feed mechanism can be simplified. Also, when this holder device is applied to a handling device, the held object will not drop from the holder device even in the case of power failure.

Figure 26:
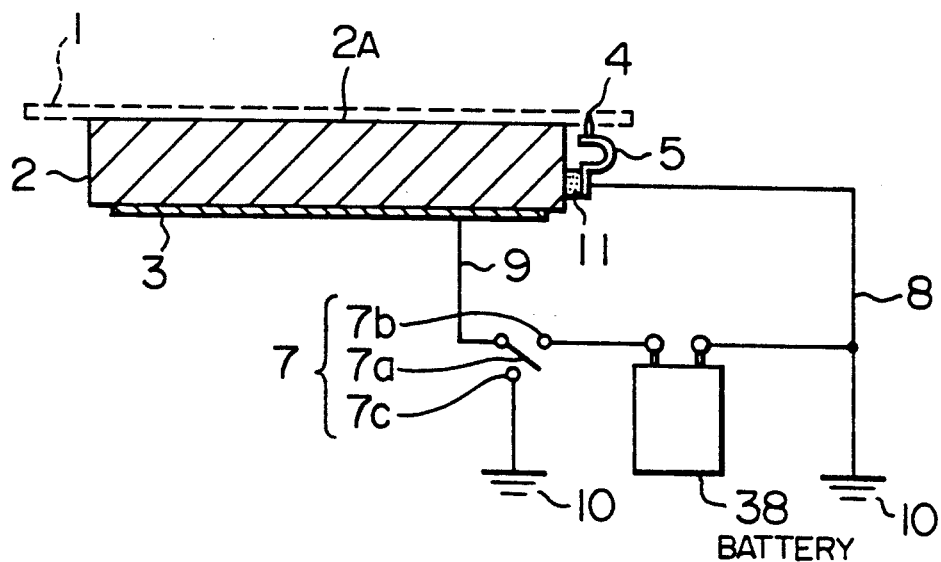
Figure 27:
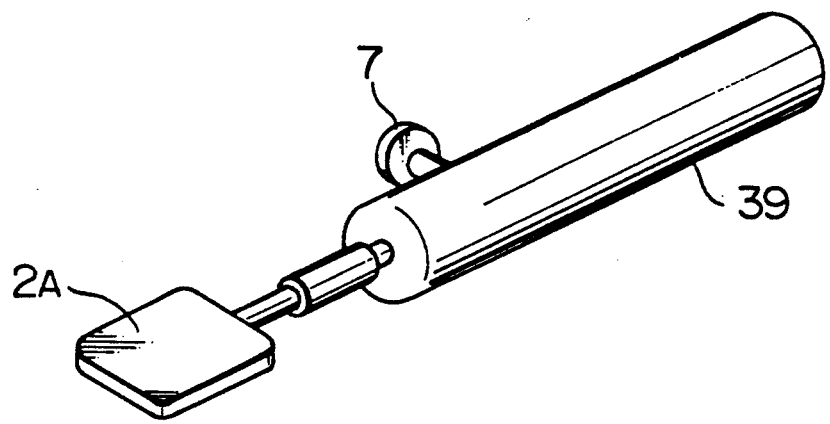
FIG. 27 is a perspective view of a handling device according to the present invention.

In a holder device shown in FIG. 26, a battery 38 is used as the voltage generating device 6. By thus constituting the voltage generating device 6 by the battery, an external power feed mechanism becomes unnecessary, and the holder device can be easily moved. FIG. 27 shows one example of handling device incorporating the holder device of FIG. 26. This handling device comprises a holder surface 2A provided at a distal end of a grip portion 39, and a switch portion 7 provided at the grip portion 39. When a wafer is to be manually handled, a vacuum pincette for holding the wafer by vacuum suction is used. In this case, a vacuum source is connected to the vacuum pincette, and therefore it is difficult to freely carry the handling device. On the other hand, in the handling device of this embodiment, the pincette is constituted by the battery-driven electrostatic attraction device, and therefore there can be provided the wafer-holding pincette which can be freely carried.

Figure 28:
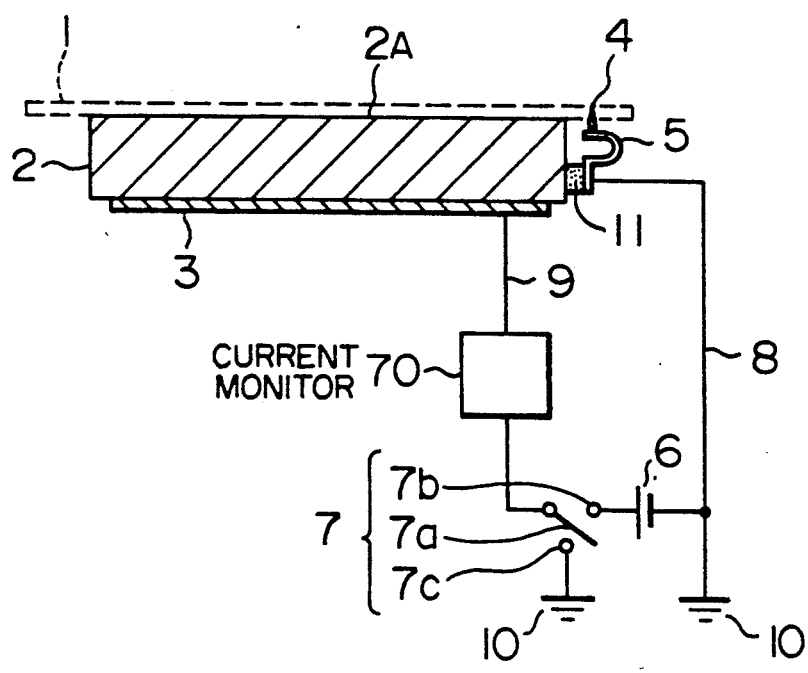
FIGS. 28 and 29 are vertical cross-sectional views of further modified hand bodies of the invention, respectively.

In a holder device shown in FIG. 28, a current monitor 70 for monitoring the value of electric current flowing through a hand body 2 is provided on a lead wire 9 intermediate opposite ends thereof. In this case, the condition of holding of an object 1 can be known from the value of the current detected by the current monitor 70. If the attractive holding is not sufficient, the value of the current is smaller than that obtained when the attractive holding is sufficient. In such a case, a voltage generating device 6 is so controlled as to increase the value of the current, thereby achieving a sufficient attractive holding.

Figure 29:
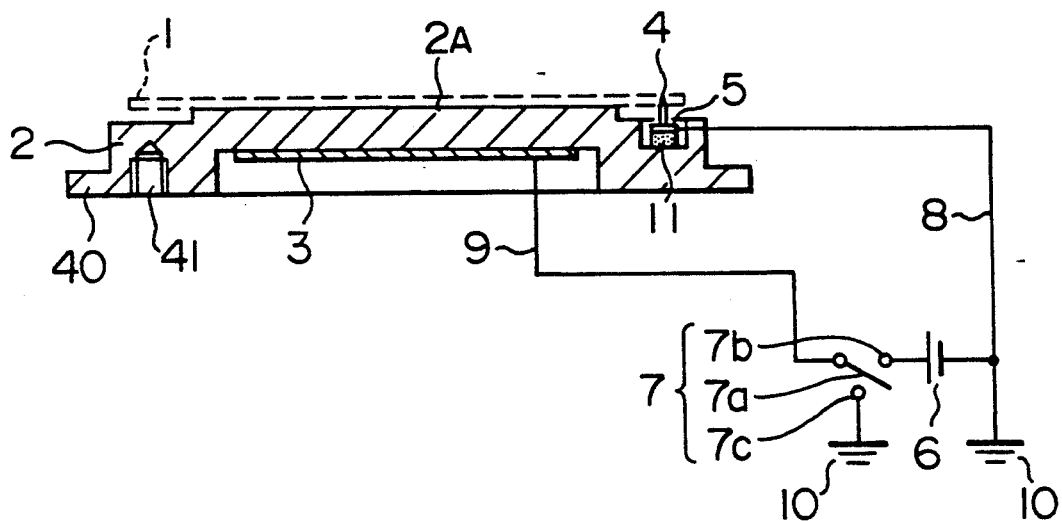
Figure 31:
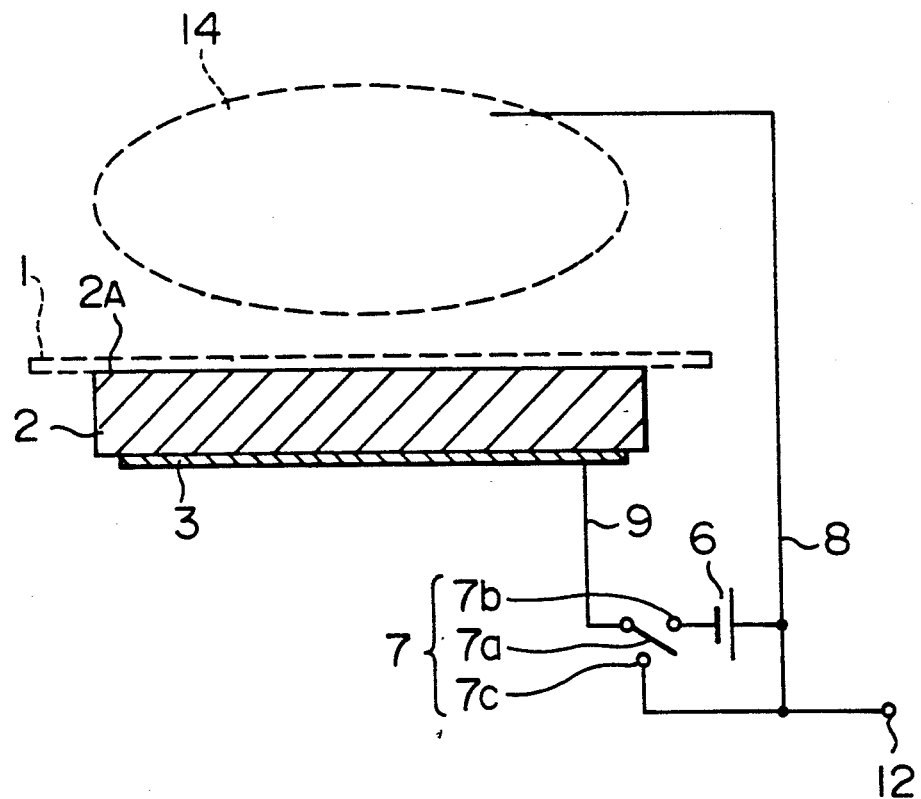
FIG. 31 is a vertical cross-sectional view of a hand body shown in FIG. 30.

FIG. 29 shows a modified form of the sixth embodiment. In this case, a bolt-receiving screw hole 41 and a flange 40 for attaching a hand body 2 to other member are provided at the hand body 2. This facilitates the attachment of the hand body 2.

FIGS. 30 to 41 show a seventh embodiment of the present invention.

Figure 30:
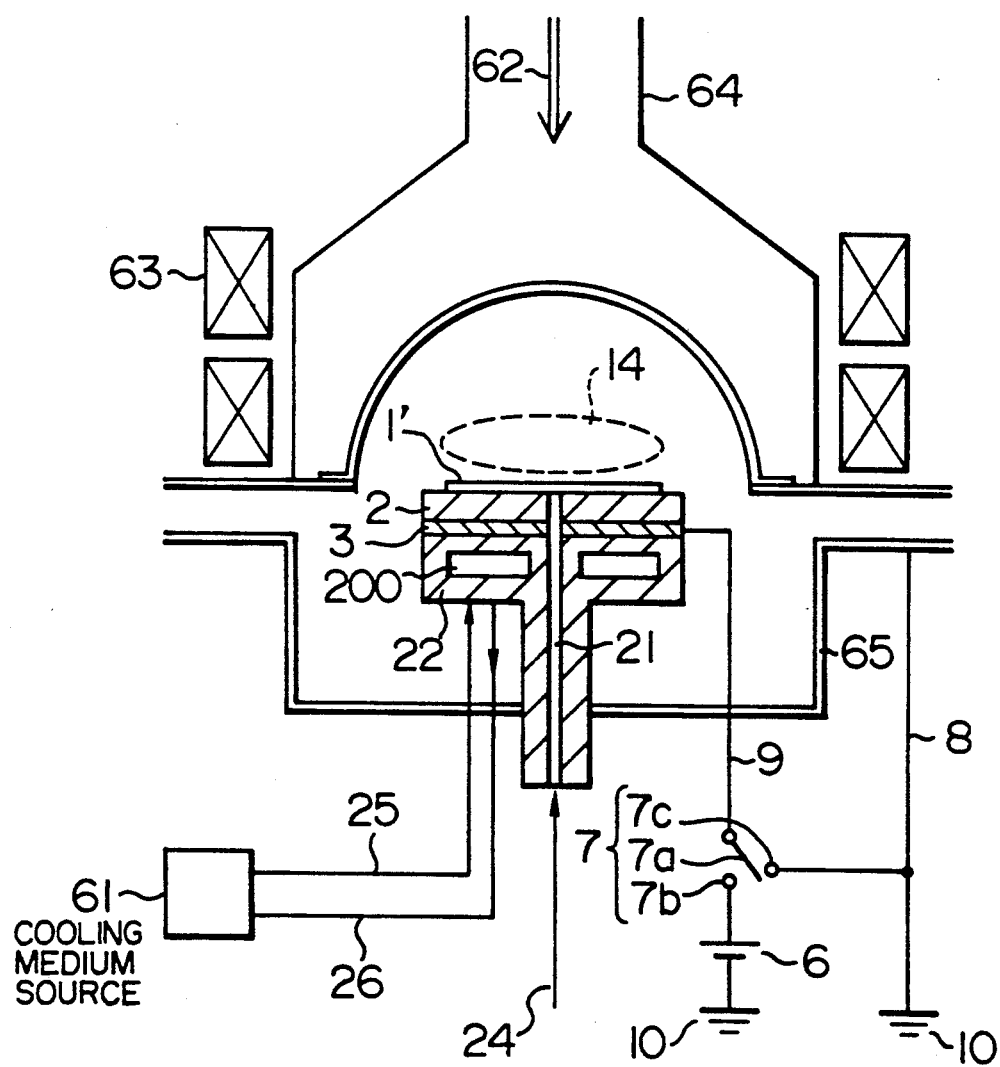
FIG. 30 is a vertical cross-sectional view of an etching apparatus according to the present invention.

FIG. 30 shows a overall construction of a microwave plasma etching apparatus according to the seventh embodiment of the present invention. This microwave plasma etching apparatus comprises a solenoid 63 mounted on an outside of an outer frame 64, a device (not shown) for applying microwave 62, a vacuum chamber 65, so on. A handling device for holding a wafer 1' is mounted within the vacuum chamber 65. In the microwave plasma etching apparatus, a plasm 14 is formed on the wafer 1' by the microwave 62, and the surface of the wafer 1' is etched by ions emitted from this plasma 14. At this time, the wafer 1' is heated, and therefore it is necessary to cool the wafer. For this purpose, a, cooler 22 is provided on a hand body 2 for fixing the wafer 1'. A cooling medium circulating chamber 200 is provided within the cooler 22. A cooling medium supply passage 25 from a cooling medium supply source 61, as well as a cooling medium discharge passage 26, is connected to the cooling medium circulating chamber 200. The cooling medium is circulated so as to cool the hand body 2 and the wafer 1'. In order to enhance a heat transfer between the hand body 2 and the wafer 1' in vacuum, there is provided a fluid supply hole 21 for supplying a heat transfer-enhancing fluid (e.g. helium gas) to a gap between the hand body 2 and the wafer 1'. The vacuum chamber 65 is grounded via a lead wire 8, and a lead wire 9 is connected to an electrode 3. The electrode 3 is selectively connected to a voltage generating device 6 and the lead wire 8 (the ground side) by a switching element 7a of a changeover switch 7. The connection of the lead wires to the electrode 3 of the hand body 2 may be done in a manner similar to that shown in FIG. 3, and the lead wire 8 may be passed through the plasma 14. Also, voltage generated by the voltage generating device 6 may be applied between the wafer 1' and the electrode 3. With this arrangement, the need for the conductive portion 4 is obviated, and the construction of the device is simplified.

Modified holder devices used in the seventh embodiment are shown in FIGS. 32 to 37.

Figure 32:
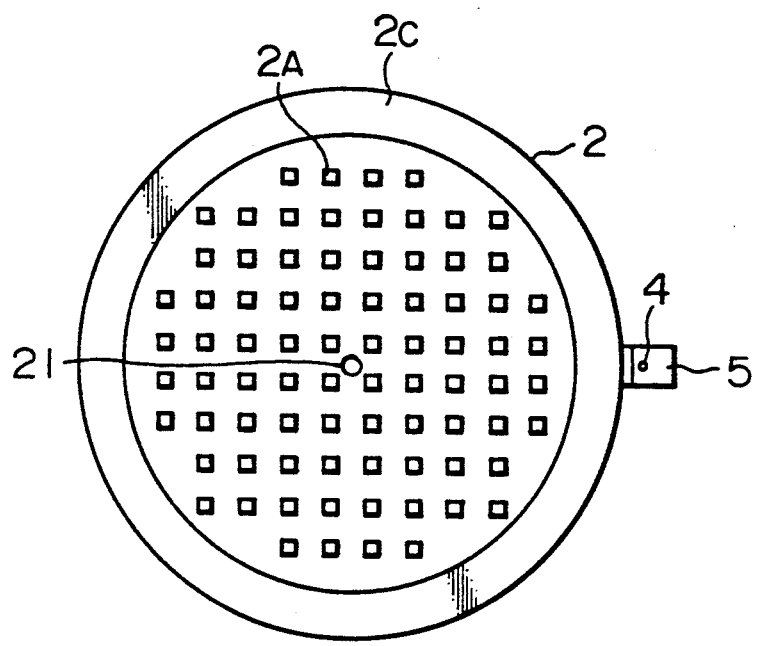
FIG. 32 is a plan view of a further modified hand body of the invention.
Figure 33:
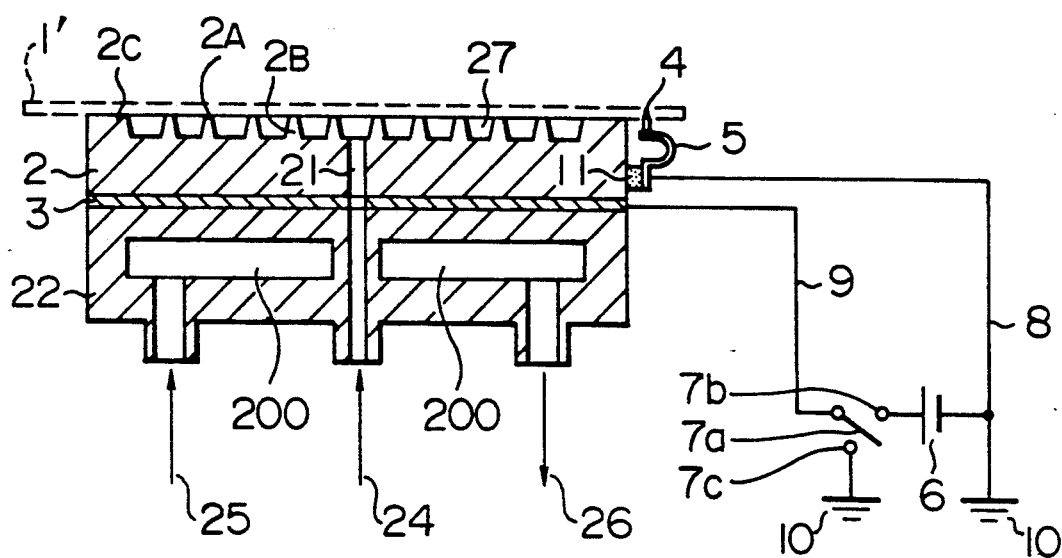
FIG. 33 is a vertical cross-sectional view of the hand body of FIG. 32.

A holder device shown in FIGS. 32 and 33 is similar to the handling device shown in FIG. 30, but differs therefrom in that a plurality of projections are formed on a holder surface 2A for a wafer 1' as in the second embodiment, and that a fluid supply hole 21 is formed in the central portion of the holder device so as to supply a heat transfer fluid to the holder surface 2A. Further, a seal surface 2C is formed on the outer peripheral portion. With this construction, even when the wafer 1' is held in intimate contact with a hand body 2, the cooling can be carried out. By the provision of the seal surface 2C, the heat transfer fluid is prevented from leaking to the outside of the device through the recesses formed between the hand body 2 and the wafer 1'. Therefore, the fluid will not flow to the outside of the holder device, so that the vacuum will not be contaminated, and besides the amount of consumption of the heat transfer fluid 24 can be reduced.

Figure 34:
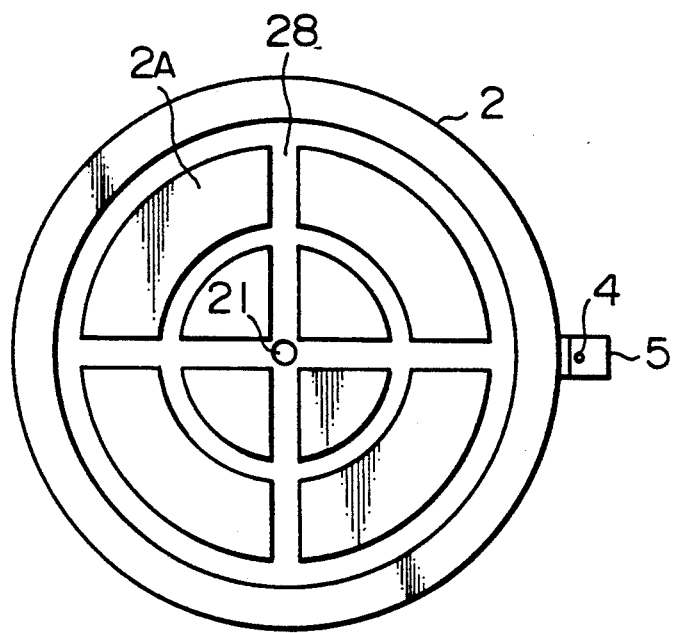
FIG. 34 is a plan view of a further modified hand body of the invention.
Figure 35:
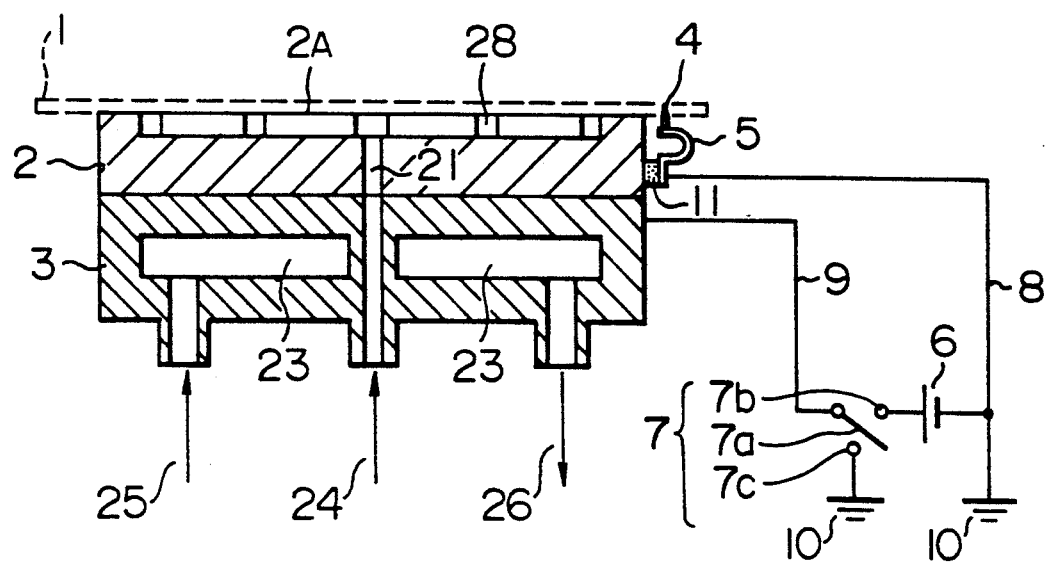
FIG. 35 is a vertical cross-sectional view of the hand body of FIG. 34.

FIGS. 34 and 35 show a modified holder device of the seventh embodiment In this example, a groove 28 of a semi-circular cross-section is formed in a holder surface 2A, and a fluid supply hole 21 is formed in a central portion of a hand body 2, and a fluid flows through the groove 28. A circulating chamber 200 through which a cooling medium circulates is provided in the interior of an electrode 3. With this construction, there is no contact thermal resistance between the electrode and the cooler, and therefore the cooling efficiency is improved as compared with the holder device of the type in which the electrode and the cooler are separate from each other. Further, the construction of the device is simplified.

Figure 36:
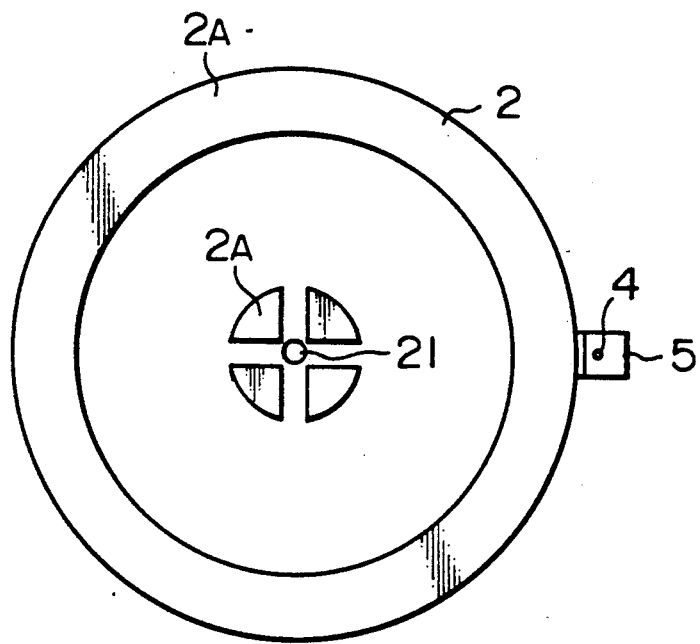
FIG. 36 is a plan view of a further modified hand body of the invention.
Figure 37:
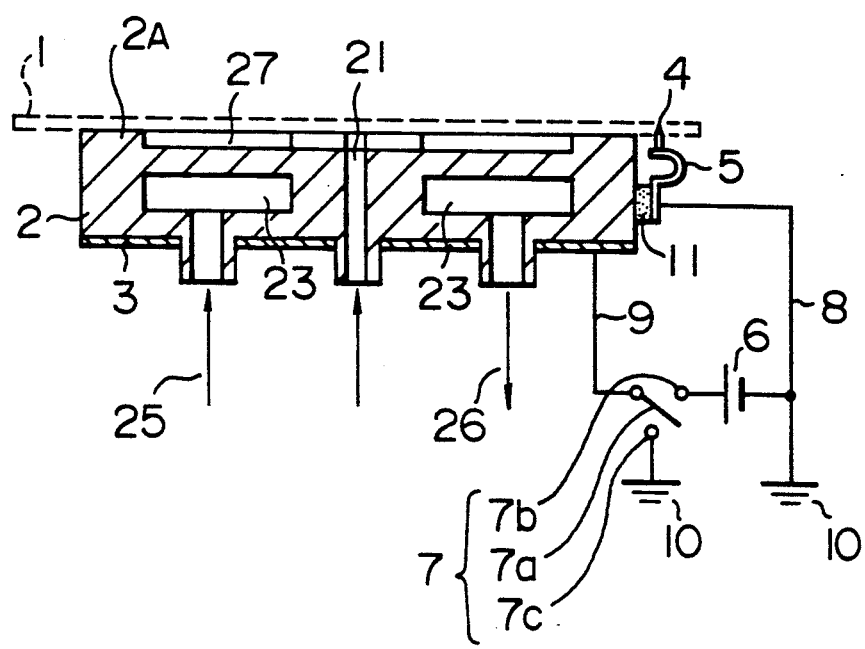
FIG. 37 is a vertical cross-sectional view of the hand body of FIG. 36.

FIGS. 36 and 37 show a modified holder device of the seventh embodiment. In this example, a circulating chamber 23 through which a cooling medium circulates is provided in the interior of a hand body 2. In this case, also, the hand body 2 can be directly cooled, so that the cooling efficiency is improved.

FIGS. 38 to 41 show holder devices according to an eighth embodiment of the invention in which a wafer held in intimate contact with a holder surface ca be heated at a uniform temperature.

Figure 38:
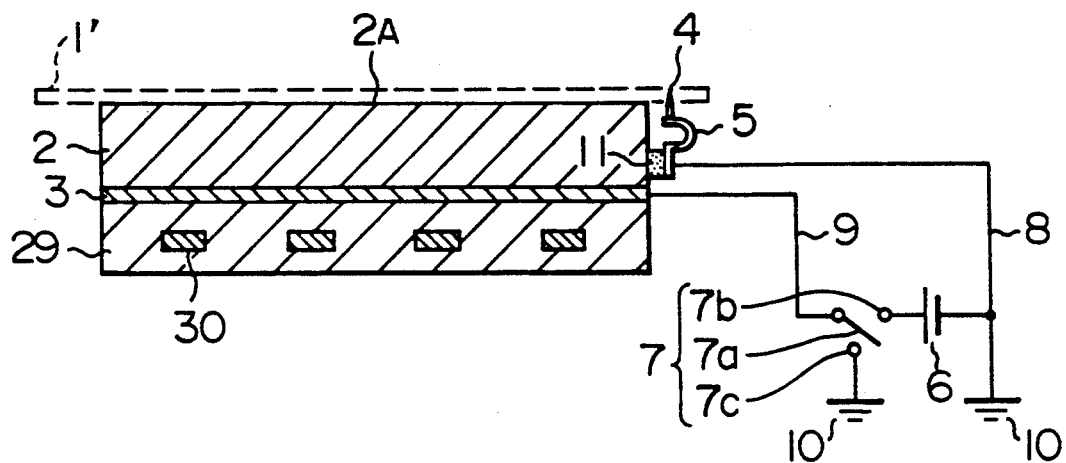
FIGS. 38, 39 and 40 are vertical cross-sectional views of further modified hand bodies of the invention, respectively.

In a holder device shown in FIG. 38, a heater 29, formed by an insulating material having a heating element 30 embedded therein, is mounted on a hand body 2 through an electrode 3. In this case, the hand body 2 is heated uniformly by the heater 29, and therefore when a wafer is held in intimate contact with the hand body 2, the wafer can be heated uniformly.

Figure 39:
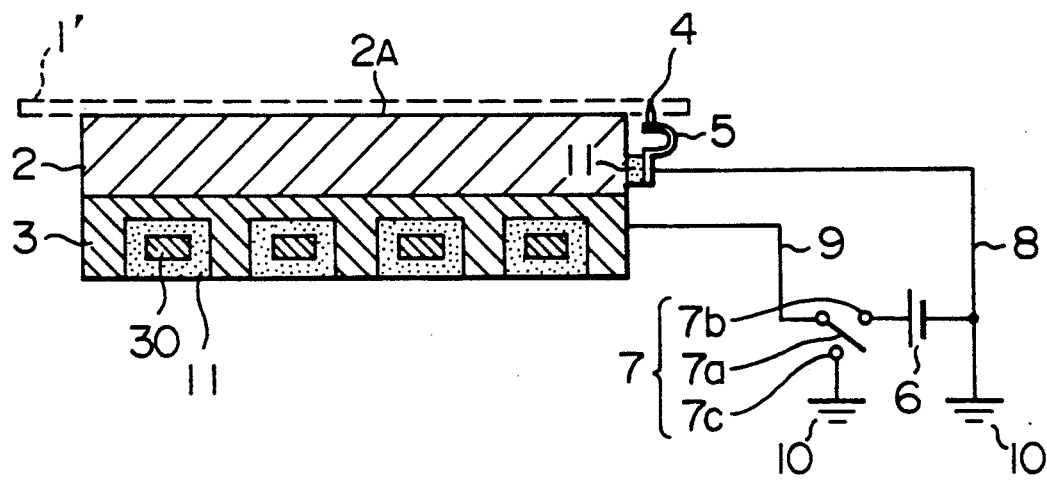

In a modified holder device shown in FIG. 39, a heating element 30 is provided in the interior of an electrode 3 through an insulating member 11. There is no contact thermal resistance between the electrode and the heater, and therefore the heating efficiency is improved as compared with the holder device of the type in which the electrode and the heater are separate from each other. Further, the construction of the device is simplified.

Figure 40:
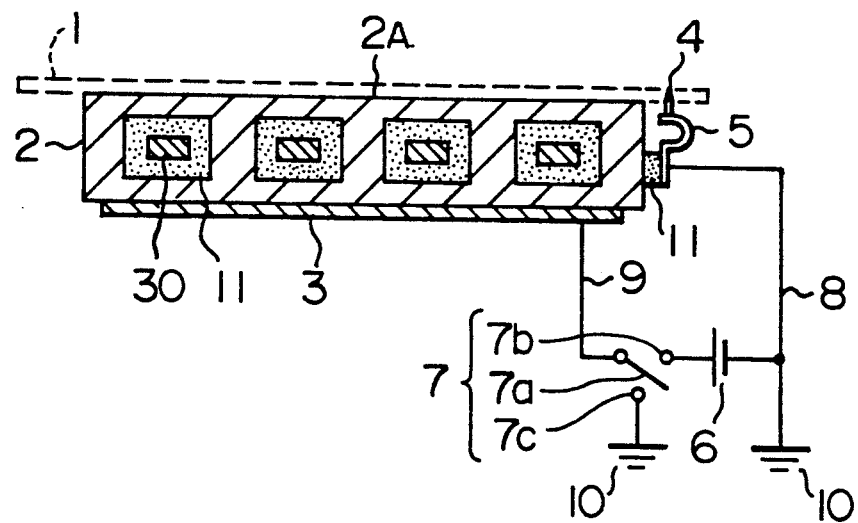

In a modified holder device shown in FIG. 40, a heating element 30 is provided in the interior of a hand body 2, and therefore the hand body 2 can be heated directly, so that the heating efficiency is improved.

Figure 41:
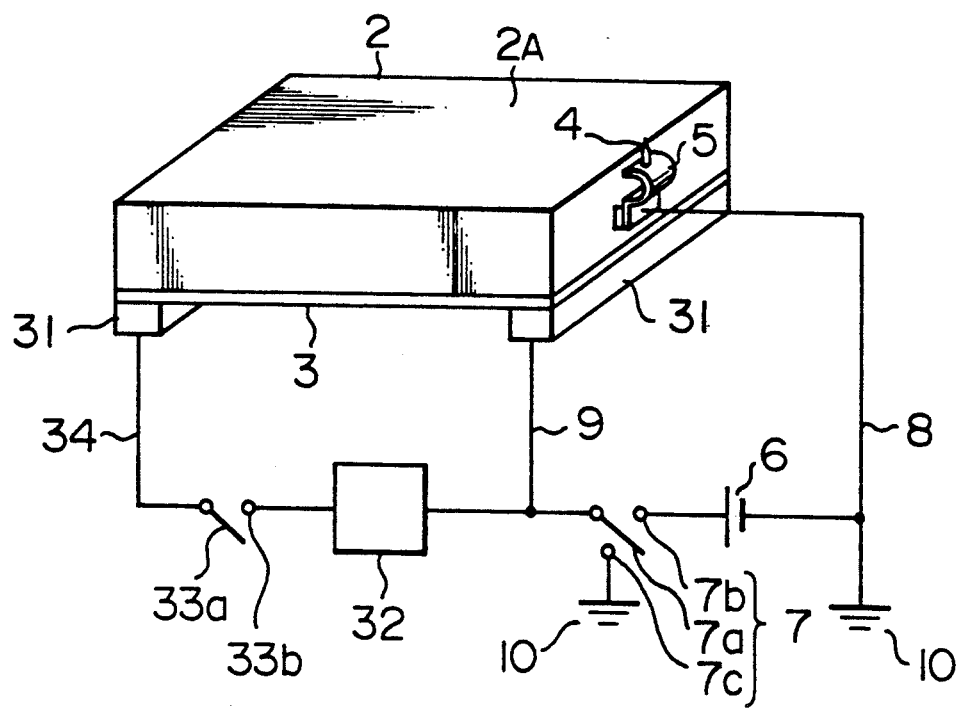
FIG. 41 is a perspective view of the hand body of FIG. 40.

In a modified holder device shown in FIG. 41, heating current terminals 31 are provided at opposite ends of an electrode 3, respectively, and lead wires 9 and 34 are connected to the two heating current terminals 31, respectively. A heater switch 33a, 33b and a heating current generating device 32 are also connected to the lead wires 9 and 34. In this example, the electrode 3 is heated by energizing the electrode 3 via the heating current terminals 31, and therefore the construction is simplified.

Next, a ninth embodiment of the present invention will now be described with reference to FIGS. 42 to 50.

Figure 42:
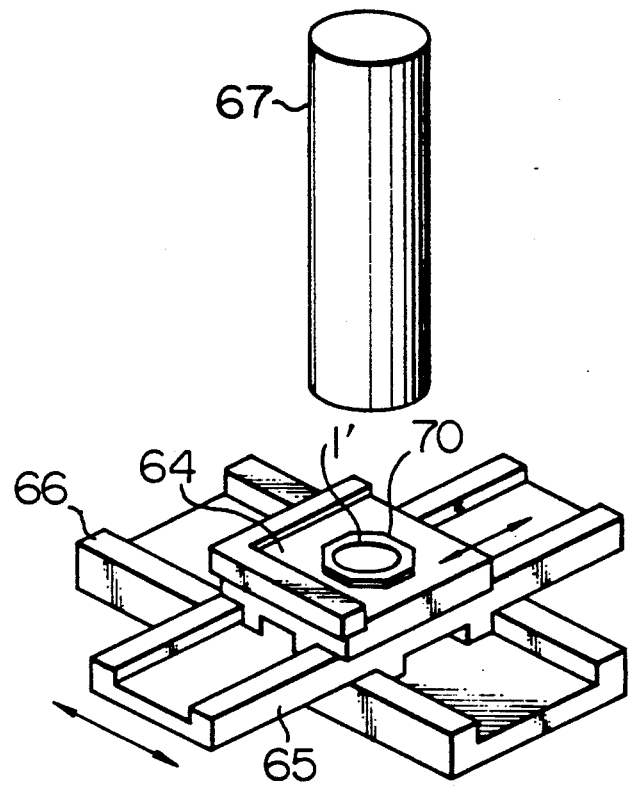
FIG. 42 is a perspective view of an electron beam image depicting apparatus according to the present invention.
Figure 43:
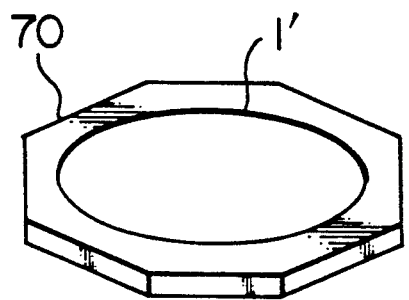
FIG. 43 is a perspective view of a pallet shown in FIG. 42.

FIG. 42 is a perspective view of an electron beam image depicting apparatus according to the present invention, and FIG. 43 is a perspective view of a pallet used in this apparatus. A wafer 1' is placed on a pallet body 70, and the pallet body 70 is fixed on an XY stage 64. While positioning the wafer 1' by the XY stage 64, a circuit pattern is formed or depicted on the wafer 1' by an electron beam generated from an electron gun column 67.

Figure 44:
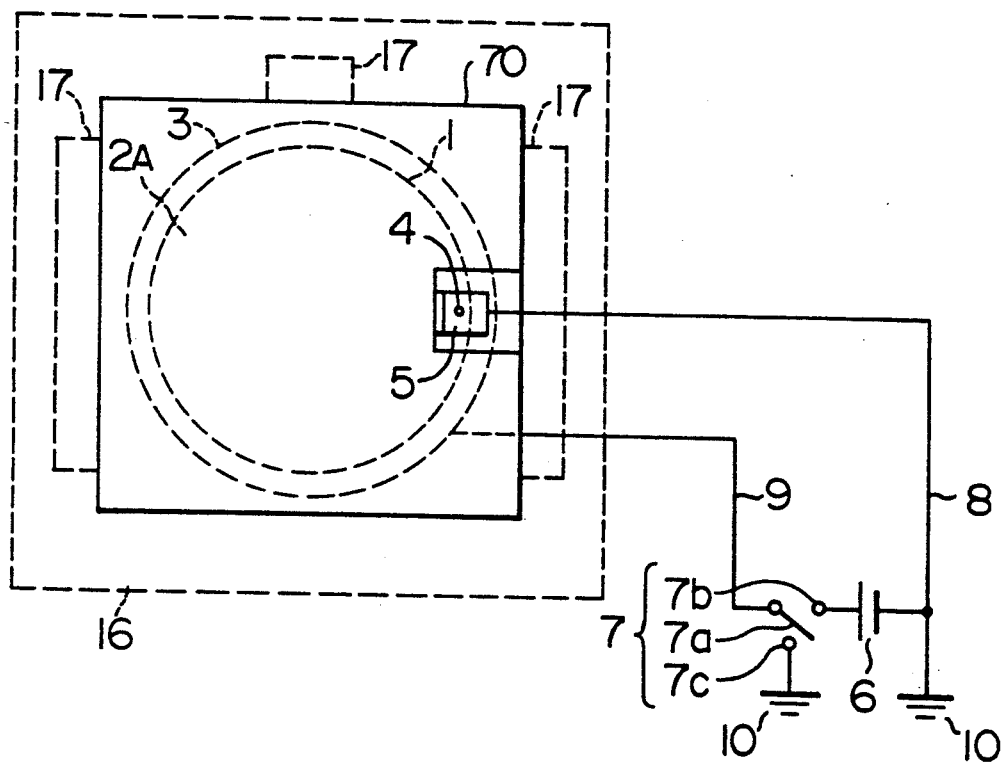
FIG. 44 is a plan view of a further modified hand body of the invention.
Figure 45:
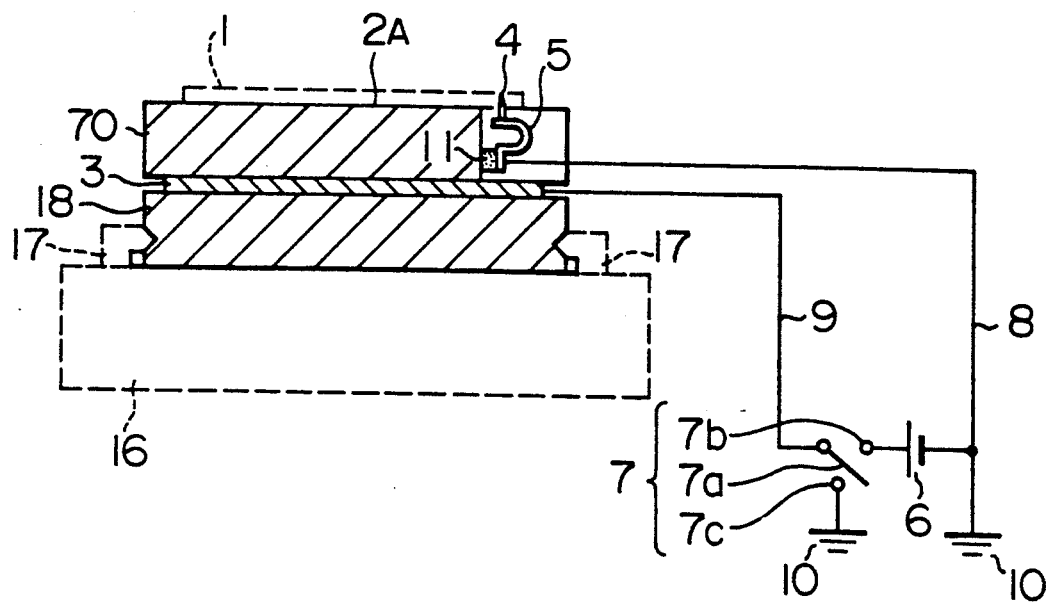
FIG. 45 is a vertical cross-sectional view of the hand body of FIG. 44.

FIGS. 44 and 45 show the pallet body 70 of FIG. 43 on an enlarged scale, and the construction shown therein is similar to that shown in FIGS. 3 and 4, but differs therefrom in that a base portion 18 for fixing the pallet to a bed 16, as well as a fixing mechanism 17, is provided at the pallet body 70. With this construction, the wafer 1' can be held on the pallet body 70 in a flat manner or in intimate contact therewith.

Figure 46:
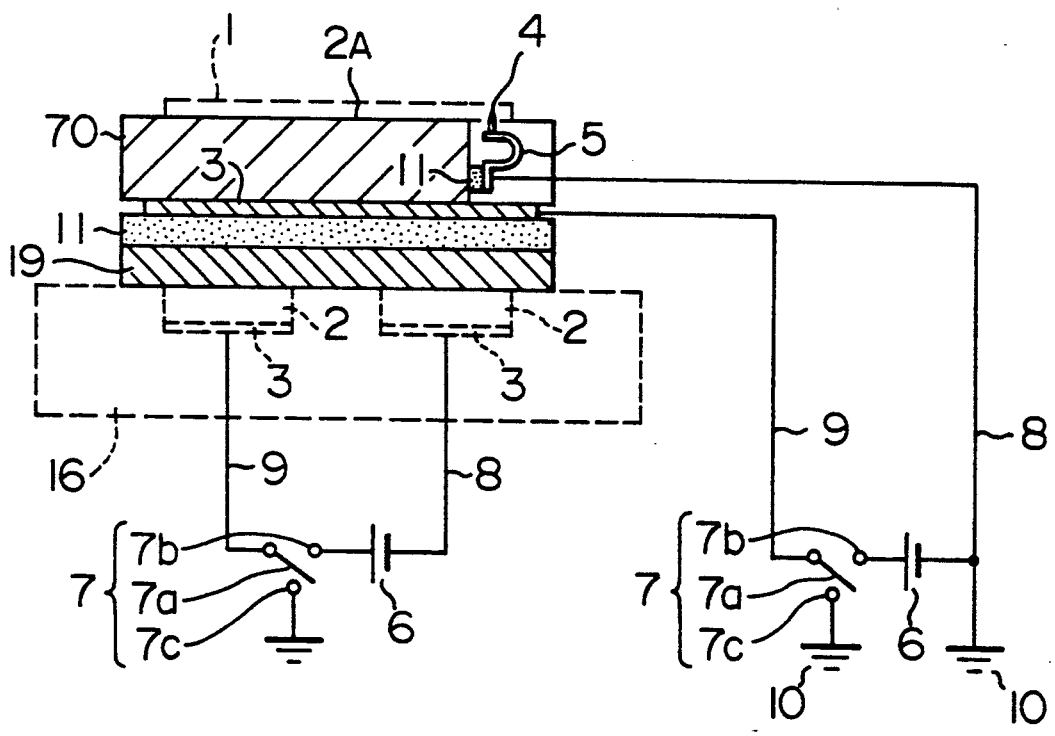
FIG. 46 is a vertical cross-sectional view of a further modified hand body of the invention.

FIG. 46 shows a modified pallet body. A conductor or a semiconductor 19 is formed on the reverse side of the pallet body 70 via an electrode 3 and an insulating member 11. An electrostatic attraction mechanism is provided on a bed 16, and the pallet body 70 is attractively held on the bed 16 by electrostatic force. With this construction, the need for a movable portion movable in vacuum is obviated, and therefore the reliability of the device is improved.

Figure 47:
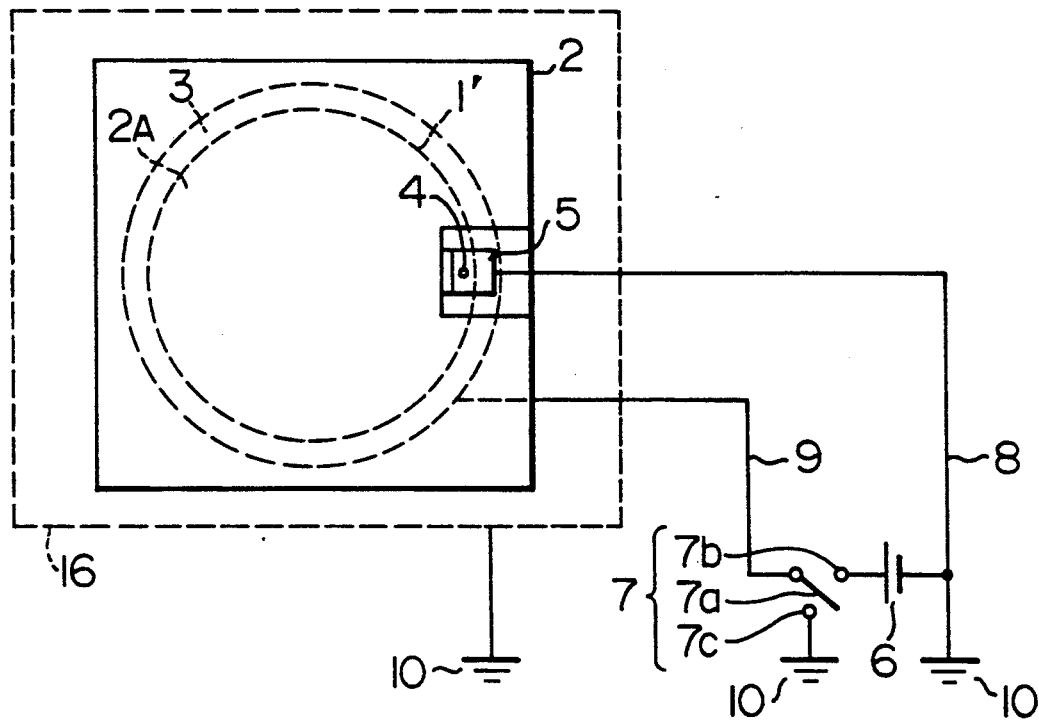
FIG. 47 is a plan view of a further modified hand body of the invention.
Figure 48:
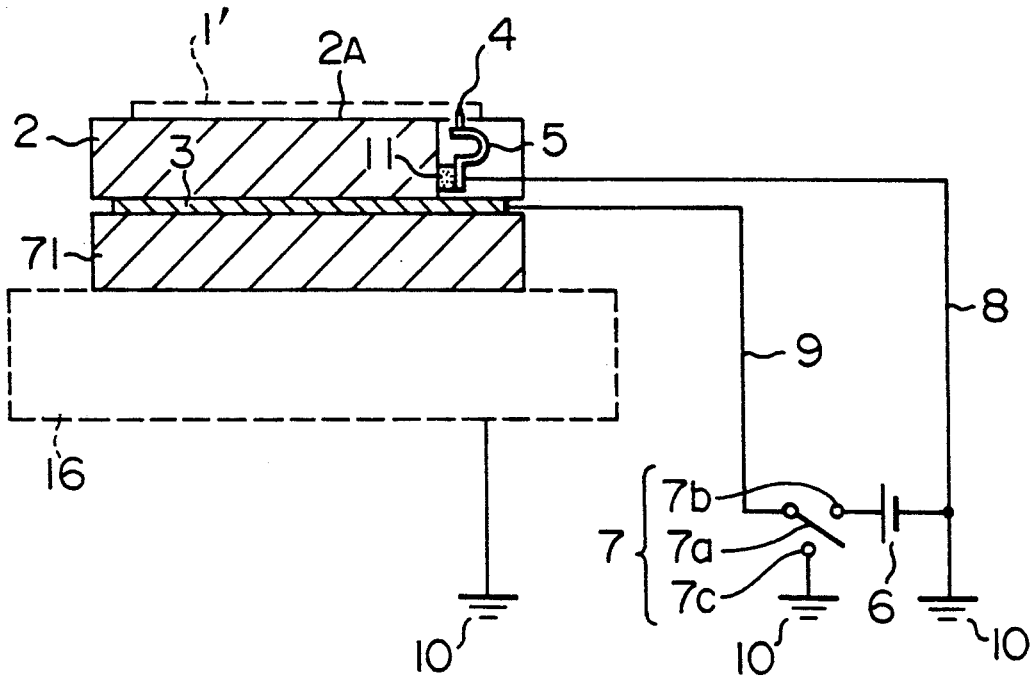
FIG. 48 is a vertical cross-sectional view of the hand body of FIG. 47.

FIGS. 47 and 48 show a modified pallet body. This construction is characterized in that an electrode 3 is interposed between a dielectric, constituting the pallet body 2, and a pallet fixing dielectric 71. A wafer 1' and a bed 16 are grounded to an earth potential an ambient environment. Voltage is applied between the electrode 3 and both of the wafer 1' and the bed 16, so that the wafer 1' is attractively held on a holder surface 2A of the pallet body 2, and at the same time the pallet is attractively held on the bed 16. In this example, the construction is simplified.

Figure 49:
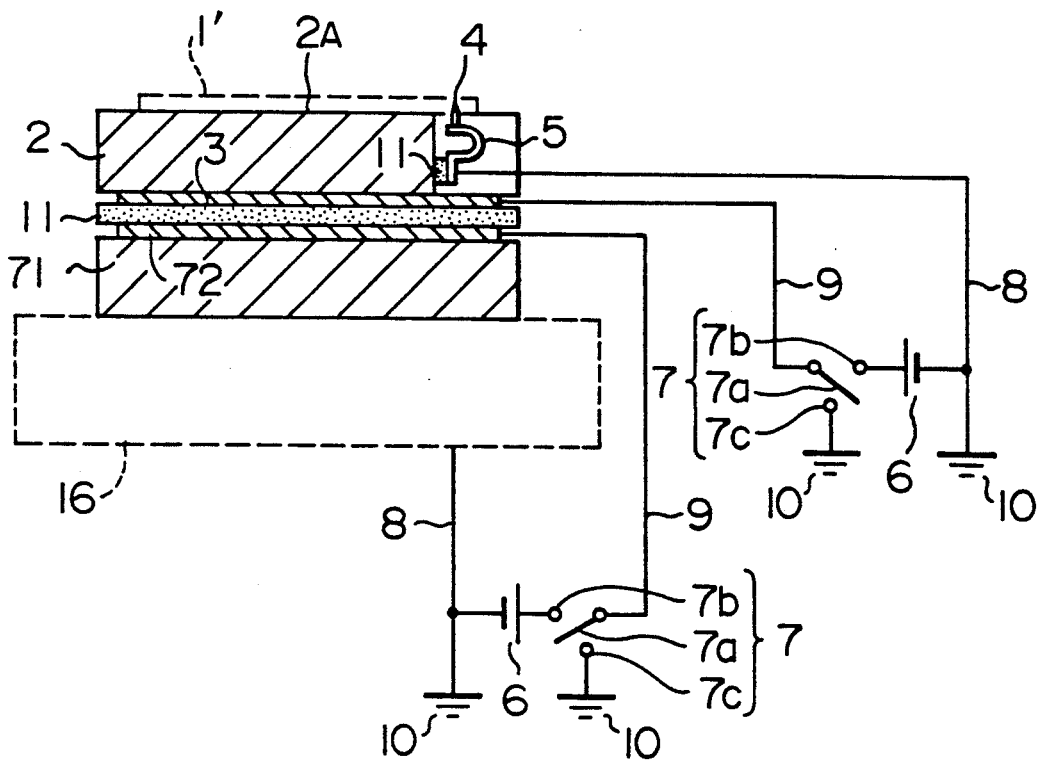
FIGS. 49 and 50 are vertical cross-sectional views of further modified hand bodies of the invention, respectively.

A further modified pallet body shown in FIG. 49 comprises a pallet fixing dielectric 71 for fixing a pallet to a bed 16, and a pallet fixing electrode 72. With this construction, the attractive holding of a wafer 1' on the pallet and the fixing of the pallet to the bed can be effected at the same time, and therefore the wafer is not moved during transport of the pallet.

Figure 50:
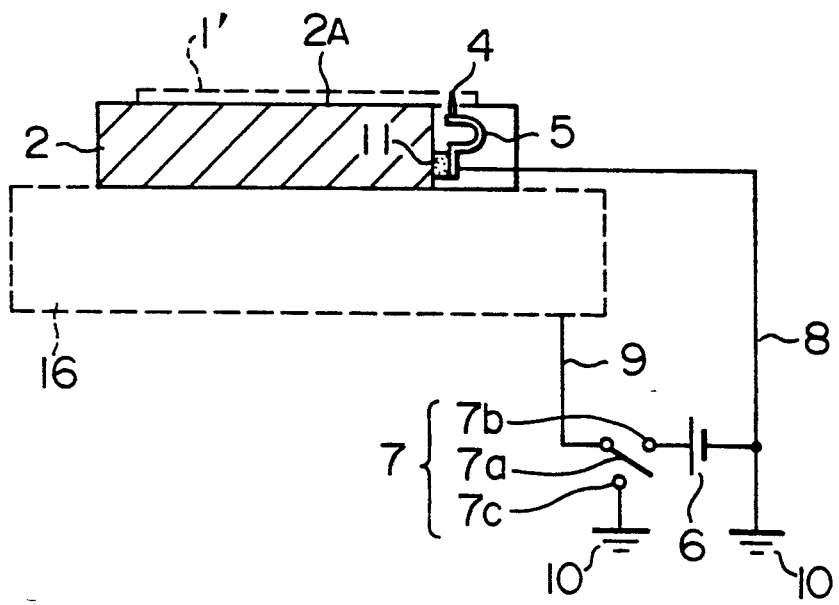

In a further modified pallet body shown in FIG. 50, a bed 16 can be used as an electrode, and this simplifies the construction.

In the embodiment of FIGS. 3 and 4, the magnitude $10^{10}$ Ωcm of the specific resistance or resistivity of the dielectric such as SiC is a value in the operating state thereof.

What is claimed is:

1. A holder device for attractively holding an object so as to handle or fix the same, comprising:
   a hand body having a holder surface portion for attractively holding the object, at least the holder surface portion of said hand body being made of a dielectric having a resistivity of not more than $10^{10}$ Ωcm;
   an electrode provided on that surface of said hand body facing away from said holder surface portion; and
   a voltage generating device for producing a potential difference between said electrode and the object.

2. A holder device according to claim 1, in which said dielectric constituting said hand body is composed of SiC.

3. A holder device according to claim 1, in which an electrically-conductive cover is provided on an outer periphery of said hand body through an insulating ember in such a manner as to cover an outer surface of said hand body, said electrically-conductive cover being grounded to an earth.

4. A holder device according to claim 2, in which a crystal structure of said dielectric belongs to a hexagonal system and is of α type.

5. A holder device for attractively holding an object, comprising:
   a hand body having a holder surface portion for attractively holding the object, at least the holder surface portion of said hand body being made of a dielectric having a resistivity of not more than $10^{10}$ Ωcm;
   an electrode provided on that surface of said hand body facing away from said holder surface portion;
   a voltage generating device for producing a potential difference between said electrode and the object;
   an electrically-conductive portion for maintaining said object at an earth potential; and
   a change-over switch for electrically connecting said electrode to the earth when the object is to be released from said holder surface portion.

6. A holder device according to claim 5, in which said dielectric is composed of α-type SiC belonging to a hexagonal system in crystal structure.

7. A holder device according to claim 5, in which said dielectric is composed of α-type SiC belonging to a hexagonal system in crystal structure.

8. A holder device according to claim 5, in which projections are formed on said holder surface portion.

9. A holder device according to claim 5, in which steps formed by recesses and projections are provided on said holder surface portion.

10. A holder device according to claim 5, in which a grip portion is provided at an end portion of said hand body.

11. A holder device according to claim 5, in which a circulating chamber for conducting a cooling medium therethrough is provided in said hand body, there being provided a flow passage for circulating the cooling medium, cooled by a cooler, through said circulating chamber.

12. A holder device according to claim 5, in which a heating element is provided on said hand body.

13. A holder device according to claim 5, in which said hand body is composed of dielectric ceramics, said electrode is composed of electrically-conductive ceramics, and a molded body of said dielectric ceramics and a molded body of said electrically-conductive ceramics are sintered together to provide an integral sintered body.

14. A holder device according to claim 5, in which a film of a material of the same kind as that of the dielectric constituting the body of said device is formed on said holder surface portion.

15. A holder device according to claim 5, in which a capacitor is connected in parallel with said voltage generating device.

16. A holder device according to claim 5, in which a current sensor is connected in series with said voltage generating device.

17. A holder device according to claim 5, in which there is provided an electrically-conductive portion which is adapted to be contacted with the object when said object is attractively held on said holder surface portion, said electrically-conductive portion being at an earth potential.

18. A holder device for attractively holding an object, comprising;
   a hand body having a holder surface portion for attractively holding the object, at least the holder surface portion of said hand body being made of a dielectric having a resistivity of not more than $10^{10}$ Ωcm;
   first and second electrodes provided on that surface of said hand body facing away from said holder surface portion;
   a first voltage generating device for producing a potential difference between said first and second electrodes;
   a second voltage generating device for producing a bias voltage at one of said electrodes having a lower potential; and
   means for adjusting the potential of said second voltage generating means so as to bring the potential of the object, held on said holder surface portion, to substantially 0 volt.

19. A holder device according to claim 18, in which there is provided a change-over switch for short-circuiting said first and second electrodes to each other when the object is to be released from said holder surface portion.

20. A semiconductor producing apparatus comprising:
   a loader chamber for accommodating a cassette case receiving a semiconductor wafer;
   processing chambers for subjecting said semiconductor wafer to treatments including a heat treatment;
   an unloader chamber for accommodating said semiconductor wafer subjected to said treatments;
   a handling device for attractively holding said semiconductor wafer and for moving said semiconductor wafer;
   a vertically-movable shaft moved upward and downward by said handling device;
   a swingable arm connected to said vertically-movable shaft via a rotatable shaft; and
   a holder device mounted on a distal end of said arm, said holder device comprising (i) a holder portion having a holder surface portion for attractively holding said semiconductor waver, at least the holder surface portion of said holder portion being made of a dielectric having a resistivity of not more than $10^{10}$ cm, (ii) an electrode provided on that surface of said holder portion facing away from said holder surface portion, and (iii) a voltage generating device for producing a potential difference between said electrode and said semiconductor wafer.

21. A semiconductor producing apparatus comprising a microwave radiating device; and a holder device for attractively holding a wafer in a vacuum chamber, whereby a plasma etching is effected by radiating a microwave from said microwave radiating device;
   said holder device comprising (i) a hand body having a holder surface for attractively holding said wafer, the holder surface portion of said hand body being made of SiC, (ii) an electrode provided on that surface of said hand body facing away from said holder surface portion, and (iii) a voltage generating device for producing a potential difference between said electrode and said wafer.

22. A semiconductor producing apparatus comprising an electron gun column; and a holder device mounted on the XY stage so as to attractively hold a wafer, whereby a circuit pattern is formed on said wafer by an electron beam from said electron gun column;
   said holder device comprising (i) a holder portion having a holder surface portion for attractively holding said wafer, at least the holder surface portion of said holder portion being made of a dielectric having a resistivity of not more than $10^{10}$ Ωcm, (ii) an electrode provided on that surface of said holder portion facing away from said holder surface portion, and (iii) a voltage generating device for producing a potential difference between said electrode and said wafer.

23. A semiconductor producing apparatus according to claim 22, in which a second object attracting mechanism is provided on that surface of said holder device facing away from said holder surface portion, so as to fix said holder device.

* * * * *